United States Patent
Britcher et al.

(10) Patent No.: US 10,696,451 B2
(45) Date of Patent: Jun. 30, 2020

(54) SOLAR PANEL FIELD ARRAY SUPPORT SYSTEM AND APPARATUS AND METHOD FOR CONSTRUCTION USE

(71) Applicants: Eric Bramwell Britcher, San Jose, CA (US); Jeffrey Allen Moore, San Jose, CA (US); John Andrew Samuels, San Francisco, CA (US)

(72) Inventors: Eric Bramwell Britcher, San Jose, CA (US); Jeffrey Allen Moore, San Jose, CA (US); John Andrew Samuels, San Francisco, CA (US)

( * ) Notice: Subject to any disclaimer, the term of this patent is extended or adjusted under 35 U.S.C. 154(b) by 232 days.

(21) Appl. No.: 15/475,095

(22) Filed: Mar. 30, 2017

(65) Prior Publication Data
US 2017/0313470 A1 Nov. 2, 2017

Related U.S. Application Data

(63) Continuation of application No. 14/224,061, filed on Mar. 24, 2014, now abandoned, which is a
(Continued)

(51) Int. Cl.
*B65D 19/00* (2006.01)
*B65D 19/44* (2006.01)
(Continued)

(52) U.S. Cl.
CPC .............. *B65D 19/44* (2013.01); *H01L 31/02* (2013.01); *H01L 31/18* (2013.01); *H02S 20/10* (2014.12);
(Continued)

(58) Field of Classification Search
CPC ......... B65D 19/44; B65D 85/48; H02S 20/00; H02S 20/10; H01L 21/6734; H01L 31/02;
(Continued)

(56) References Cited

U.S. PATENT DOCUMENTS

| 5,950,836 A | * | 9/1999 | Iwamoto | ............... B65D 81/113 |
| | | | | 206/386 |
| 7,001,130 B2 | * | 2/2006 | Ransom | ................. B25J 9/0096 |
| | | | | 206/448 |

(Continued)

*Primary Examiner* — Luan K Bui
(74) *Attorney, Agent, or Firm* — Rohm & Monsanto, PLC

(57) ABSTRACT

A combined PV panel assembly jig and forklift transport pallet is used to assemble PV panels for transport to a field array from a protected manufacturing environment. The panels are assembled to have adhesively applied rails for transport by a robotic drone on a ground-support rack and are pre-wired. The PV panel assembly jig holds, protects, and aligns the PV panels in an upside down position, opposite to their operational position, for ease of wiring in order to decrease the manual labor required in the field. Once the pallet is transported to the load station at the end of a row of solar panel racks in the field array, a robotic loader lifts the upside down PV panels from the combined PV panel assembly jig and forklift transport pallet in an arcing overhead motion that lifts, tilts, and deposits the PV panels in an upright position at the loading station of a railed rack support as ground-mounted in a solar panel field array.

11 Claims, 20 Drawing Sheets

Related U.S. Application Data continuation-in-part of application No. 13/553,795, filed on Jul. 19, 2012, now Pat. No. 9,882,067.

(60) Provisional application No. 61/804,620, filed on Mar. 22, 2013, provisional application No. 61/509,471, filed on Jul. 19, 2011.

(51) Int. Cl.
    *H01L 31/02*     (2006.01)
    *H02S 20/10*     (2014.01)
    *H01L 31/18*     (2006.01)
    *F24S 25/00*     (2018.01)
    *H01L 21/673*     (2006.01)

(52) U.S. Cl.
CPC ..... *F24S 2025/014* (2018.05); *H01L 21/6734* (2013.01); *Y10T 29/49117* (2015.01)

(58) Field of Classification Search
CPC ................ H01L 31/18; Y10T 29/49117; F24S 2025/014
USPC ............... 206/386, 600, 448, 454, 455, 499; 211/85.8, 162; 220/4.28, 6
See application file for complete search history.

(56) References Cited

U.S. PATENT DOCUMENTS

| | | | | |
|---|---|---|---|---|
| 7,431,158 | B2* | 10/2008 | Yamada | B65D 25/107 |
| | | | | 206/448 |
| 7,802,526 | B2* | 9/2010 | Brady | B65D 19/12 |
| | | | | 108/53.5 |
| 2002/0113068 | A1* | 8/2002 | Tabor | B65D 19/0028 |
| | | | | 220/4.28 |
| 2006/0226094 | A1* | 10/2006 | Cho | B65D 85/48 |
| | | | | 211/41.18 |
| 2007/0062889 | A1* | 3/2007 | Salzmann | G11B 17/225 |
| | | | | 211/41.18 |
| 2011/0192760 | A1* | 8/2011 | Joubert | B65D 19/12 |
| | | | | 206/600 |
| 2012/0080354 | A1* | 4/2012 | Heo | H01L 21/67309 |
| | | | | 206/710 |

* cited by examiner

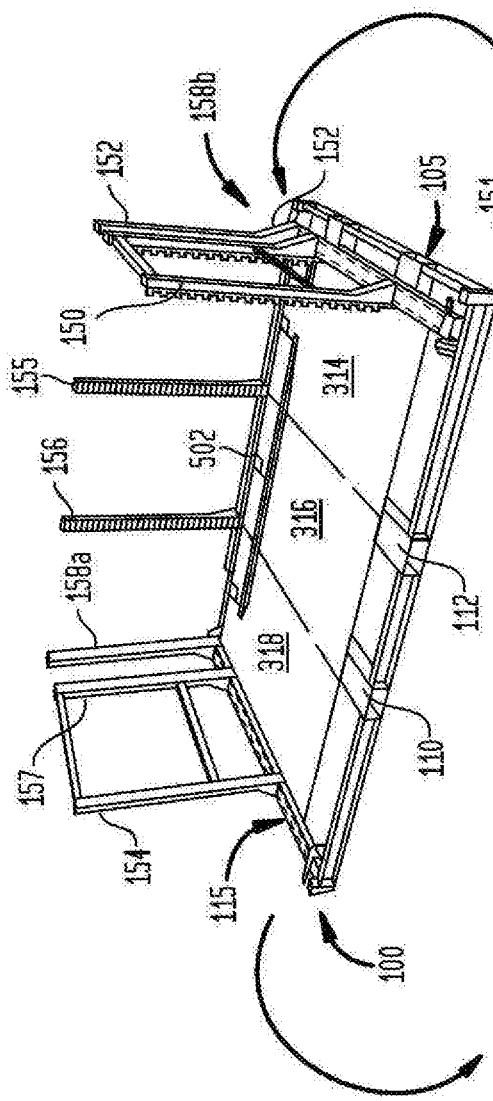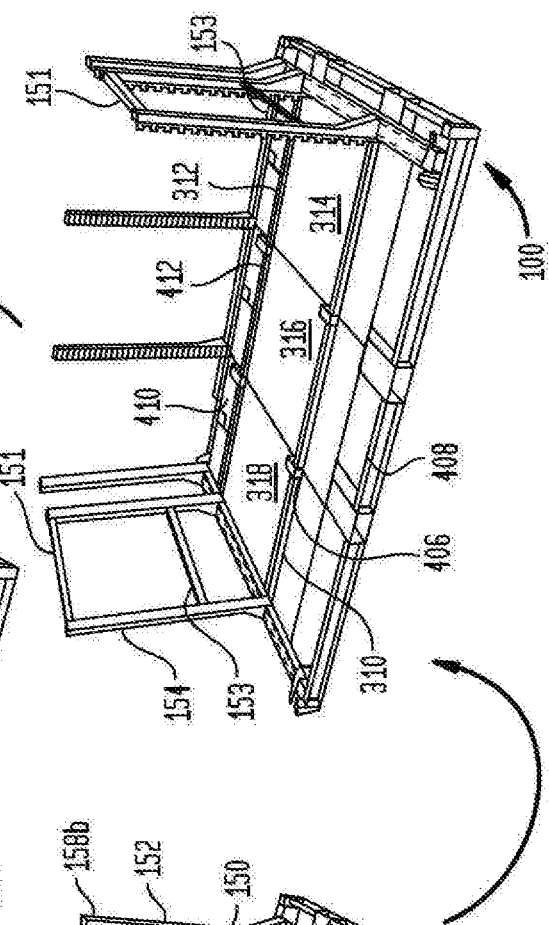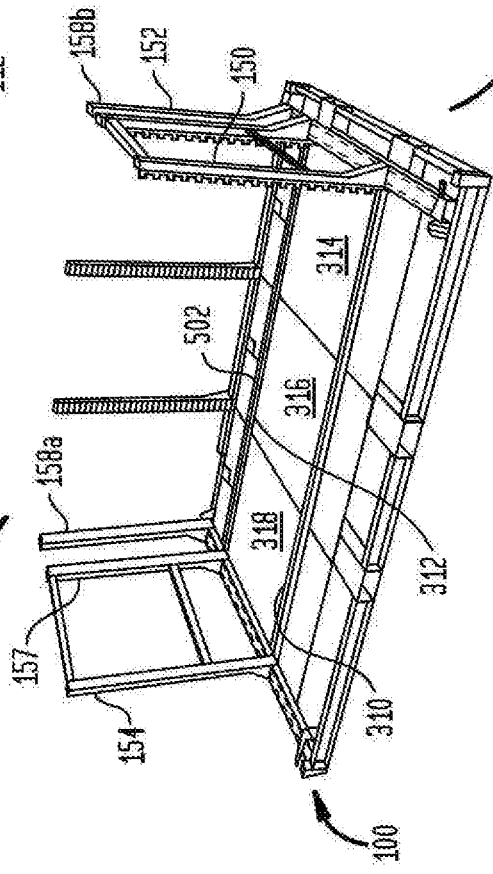

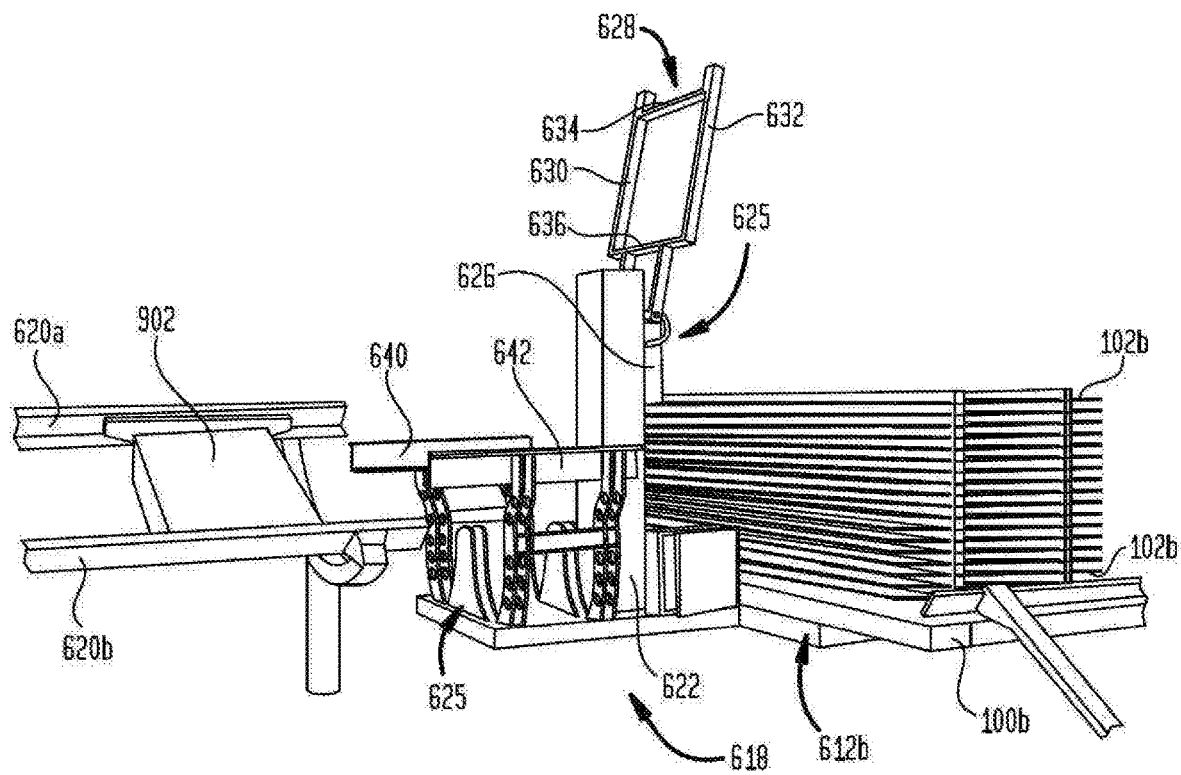
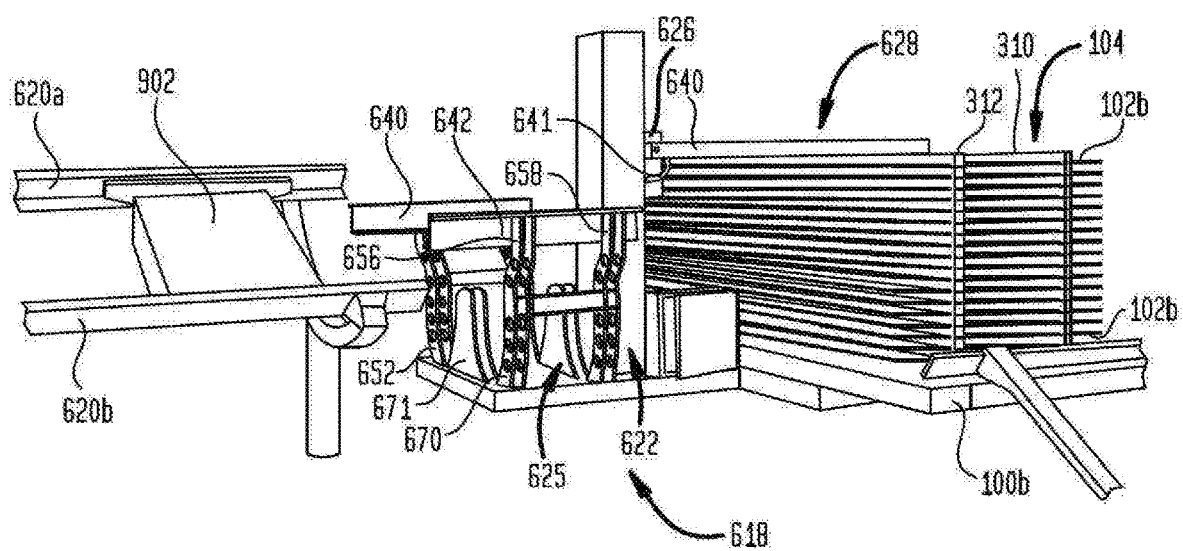

SOLAR PANEL FIELD ARRAY SUPPORT SYSTEM AND APPARATUS AND METHOD FOR CONSTRUCTION USE

RELATIONSHIP TO OTHER APPLICATION(S)

This application is a continuation of U.S. Ser. No. 14/224,061 filed on Mar. 24, 2014, now abandoned, U.S. Ser. No. 14/224,061 is a continuation-in-part of U.S. Ser. No. 13/553,795 filed on Jul. 19, 2012, now U.S. Pat. No. 9,882,067 issued on Jan. 30, 2018, and claims the benefit of the filing date of US Provisional Patent Application U.S. Ser. No. 61/804,620 filed on Mar. 22, 2013, the disclosure(s) of which are incorporated herein by reference.

GOVERNMENT RIGHTS

This invention was made under contract awarded by US Department of Energy, Contract Number DE-EE0006378 and DE-SC0009196. The government has certain rights in the invention.

BACKGROUND OF THE INVENTION

Field of the Invention

This invention relates generally to systems for transporting and installing large photovoltaic modules, and more particularly, to a photovoltaic module handling system that enables substantially automated and rapid replenishment of photovoltaic modules in a solar panel array.

Description of the Related Art

Co-pending patent application U.S. Ser. No. 13/553,795 describes an automated system for photovoltaic (PV) power plant construction. In this system, robotic shuttles deliver large panel assemblies to their mounting positions on a ground-mount rack in the form of an elevated delivery track from load stations at the end of each row of racks in a solar panel array. This system is a marked improvement over manual delivery of large panel assemblies to their final mounting positions.

A common theme in the utility scale, photovoltaic power plant construction has been to achieve cost reduction by using larger building blocks for construction. One way to do this is to pre-assemble movable PV panels into larger arrays, either at the panel manufacturer, at a local warehouse, or at the construction site. These larger building blocks must then be brought to the field for installation on a support rack systems. Field labor is required to assist in positioning the panels in their final mounting position, to install mounting clamps, and to interconnect electrical wiring. Field labor, particularly if utilizing building trades, is paid at a much higher labor rate than factory labor.

There is, thus, a need to reduce labor costs per panel by replacing field labor with factory labor.

Of course the larger building blocks are heavier to handle. Expensive aluminum rails have been used on the panels to reduce weight. There is, therefore, a need to reduce material costs by replacing panel aluminum rails with lower-cost materials, such as galvanized steel, as well as reducing the amount of components, such as clamps, required to complete the installation.

While larger building blocks can improve overall installation rates, the size and weight of both panel arrays, and large monolithic panels, means that they can no longer be handled by manual labor alone. Therefore, heavy equipment (e.g., cranes, boom trucks, ground-mounted robotic arms) may be required to deploy such panels safely. The use of heavy equipment requires some initial site grading and, frequently, re-grading as heavy equipment can create deep mud tracks and treacherous conditions, especially post-rain and snowfall. It can even bring construction to a halt until the surface is stabilized. Personnel safety is a big issue when heavy equipment is used on the work-site. In addition, special training may be required for use and maintenance of such equipment. There is, therefore, a need for an installation system that does not require the use of heavy equipment to install panel arrays.

It is therefore, an object of this invention to provide an solar panel installation system that utilizes larger building blocks, such as panel modules, but that does not require the use of large, or heavy, equipment.

In co-pending application U.S. Ser. No. 13/553,795, small automated PV shuttles, sometimes referred to as drones, support and carry panel assemblies, weighing up to 120 kg, to their final rack-mounted position. No heavy equipment is required to travel between rack rows during installation, and the size of installation crews is reduced. However, while the shuttles utilized can handle pre-panelized framed modules, they cannot handle frameless modules well. For maximum cost savings, pre-panelization of frameless modules is highly preferred. Frameless modules have the advantage of lower cost (no aluminum frame) and the frames do not have to be grounded, which is a major cost adder.

However, frameless modules are more fragile at the edges and corners. Therefore, greater care is required when handling frameless modules. There is, thus, a need for a system that can safely utilize frameless modules.

It is another object of this invention to provide a system that can take full advantage of the economies of scale and the ability to use pre-panelized modules, and particularly, frameless pre-panelized modules.

SUMMARY OF THE INVENTION

These, and other, objects features, and advantages are achieved by the present invention wherein entire solar panel arrays are populated from a single, centralized material handling location by using a specialized assembly jig that serves as a fork lift pallet and pre-positions a stacked-up array of solar panel modules for delivery to a ground-mount rack of a solar array. An advantageous aspect of the present invention is that the manual work in assembling the solar panel modules, including the installation of low-cost, adhesively applied rails that will be used to grip and transport the panels to their final destination, as well as pre-wired electrical components, is performed in a weather-protected location on smooth ground and can be located either on-site or off-site.

In addition to the foregoing, the manual handling risk to the panel is minimized because the frameless solar panel modules are pre-panelized, and most advantageously, pre-panelized in a specialized assembly jig that will be used to transport the pre-panelized solar panel arrays directly to the field array. Field-handling of PV modules is, therefore, limited to one simple loading motion at the end of the array. The rack rail-mounted robotic shuttles then take-over and deliver the PV module to its final position. By minimizing human handling of the modules, particularly at the critical final installation step where module corners are easily struck and damaged, the risks related to frameless modules are minimized and the associated cost savings can be fully realized.

In a specific embodiment of the invention, a specialized PV assembly jig and fork-lift transport pallet, herein designated "pallet jig," is provided to support, protect, and align, PV panels stacked in an upside down position, opposite to their operational position. The pallet jig is configured to be transported on the tines of a forklift truck for further transport, or to its final destination at the field array. Once the pallet is transported to the load station at the end of a row of solar panel racks in the field array, a robotic loader lifts the upside down PV panels from the combined PV panel assembly jig and forklift transport pallet in an arcing overhead motion that lifts, tilts, and deposits the PV panels in an upright position at the loading station of a railed rack support as ground-mounted in a solar panel field array.

In a method embodiment of the invention, panel assembly is accomplished while each panel of the module is uppermost on the pallet jig, and is oriented upside down (or sunny-side-down) for ease of application of the components to the underside of the PV solar panels. The pallet jig holds the individual PV solar panel modules in place in a stacked arrangement, referred to herein as a stack-up, by upright support members attached to the horizontal stringers of the pallet-like jig structure on the external supports on the back side and the shorter, longitudinally-spaced apart sides of the pallet. The upright corner support members on the longitudinally-spaced apart sides of the pallet jig are pivotably, or removably, connected and held in place by a latching mechanism, for example, so that they can be laid out of the way for ease of removing the modules from the stack-up.

The upright corner support members, as well as the upright support members on the back of the pallet jig, are provided with protrusions, illustratively lugs, for positioning a solar panel module in place relative to a second solar panel module installed on top of the first solar panel module, as a series of modules being so stacked to comprise a multi-layer stack-up. The protrusions interengage with rails that are installed on the backside of the solar panels, illustratively, by an adhesive strip. The panels are supported and spaced apart by the lugs so that the height of the applied adhesive strip remains uniform.

BRIEF DESCRIPTION OF THE DRAWING

Comprehension of the invention is facilitated by reading the following detailed description, in conjunction with the annexed drawing, in which:

FIGS. 11a, 11b, and 11c are perspective semi-schematic views respectively showing successive panelization assembly steps of the bottom PV glass panel utilizing the pallet jig of FIG. 1;

FIG. 22 is a perspective view of the solar panel transfer robot (as also seen in FIGS. 16 and 17) illustrating the same empty at the approximate midpoint of the transfer stroke of the pick-up arm of the inverter-rack loader robot as shown in FIG. 17, and also showing the tiltable drone loading station;

FIG. 23 is a perspective view, similar to FIG. 22, showing a transfer robot with its panel transfer arm gripping the rails of an inverted PV solar panel assembly supported uppermost on solar panel stack-up 102 of FIG. 1, and illustrating a portion of the associated pivotable end support posts unlatched and pivoted down and out of the way during the PV panel transfer operation;

DETAILED DESCRIPTION

Figure 1:
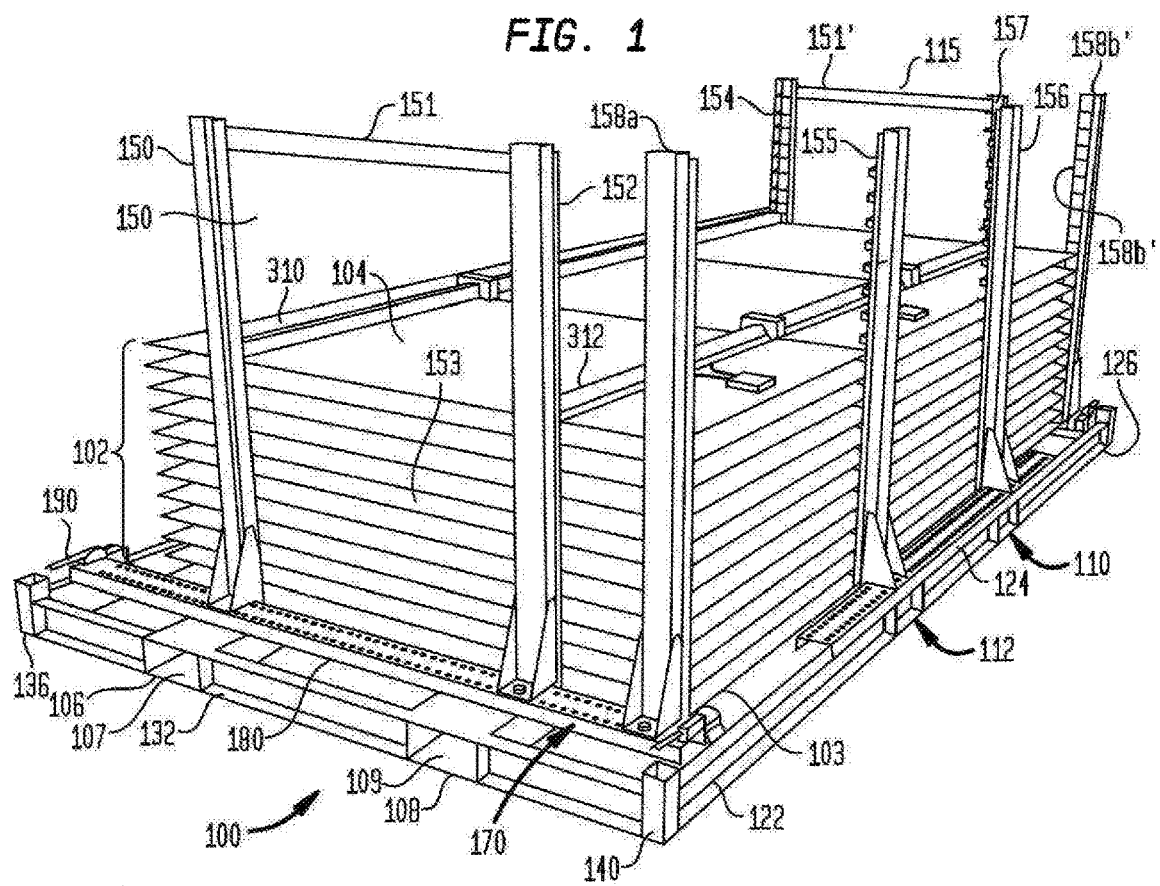
FIG. 1 is a perspective view of a combined PV panel assembly jig and forklift transport pallet that is prepared in a panelization station, such as shown in FIG. 12, for use in the practice of a specific illustrative embodiment of the invention.
Figure 18:
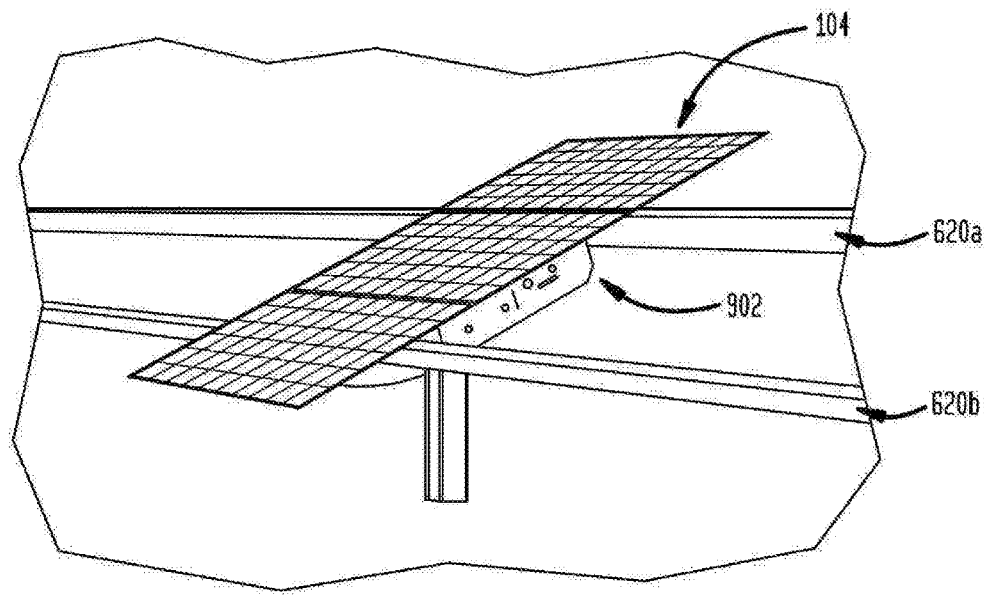
FIG. 18 is a perspective view showing a solar panel module supported on an associated operable computerized drone which is in turn movable on the ground-installed rail rack system in an operable embodiment of the invention.

FIG. 1 is a a perspective representation of a combined PV assembly jig and forklift transport pallet 100, herein designated "pallet jig," on which a stack-up 102 of PV modules 104 are individually jigged bottom-first and oriented upside-down relative to their operational orientation when mounted on a support rack in a solar panel array, such as the support rack shown on FIG. 18. Components of pallet jig 100 are shown in greater detail in FIGS. 2, 3, and 4. Pallet jig 100 is re-usable and serves as both a panelization jig in forming the inverted stack-up 102 of PV modules 104 and a transfer pallet that is removably engageable and supportable on the tines of a suitable forklift truck for transport to rack array panel loading stations in a field-installed solar panel array.

Figure 2:
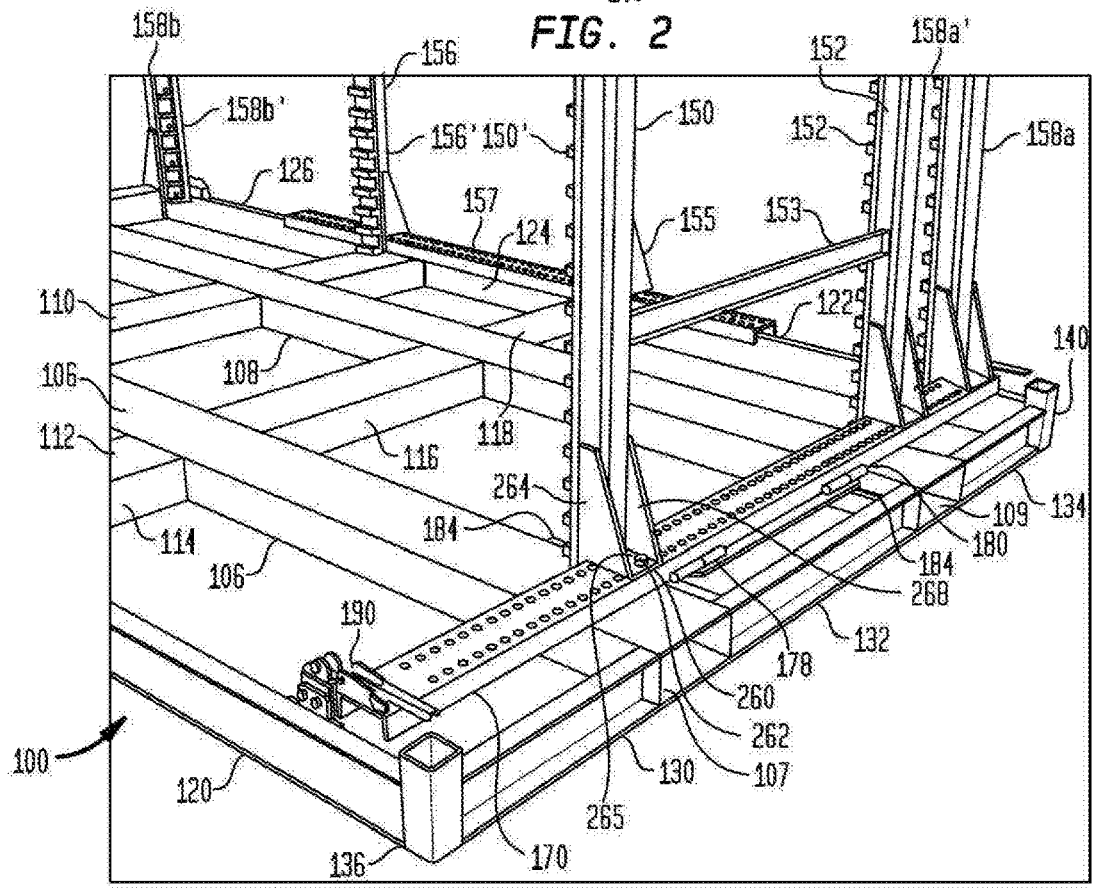
FIG. 2 is a fragmentary perspective view of the PV panel assembly jig and fork lift transport pallet of FIG. 1 in an empty condition.
Figure 4:
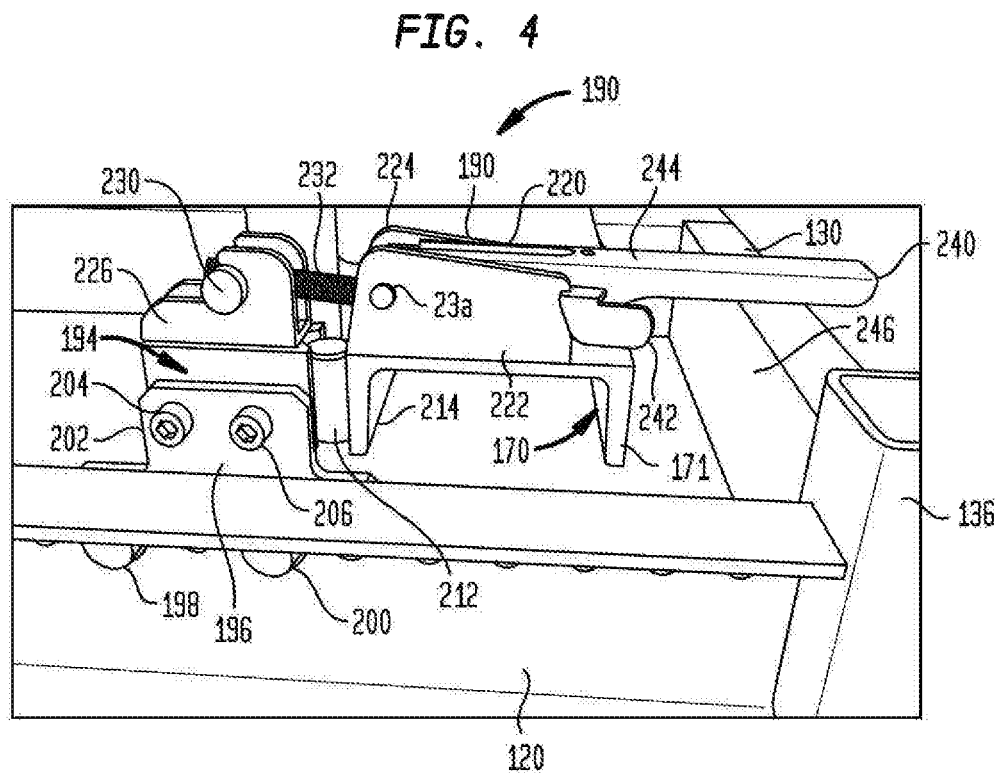
FIG. 4 is a fragmentary enlarged perspective view of the details of a slide-out end assembly of the palletjig illustrating the adjustable draw latch and location-establishing pallet jig components as also seen in FIGS. 2 and 3 on a smaller scale.

As best shown in the assembled views of FIGS. 1 and 2, pallet jig 100 is made of robust steel pallet frame components, including laterally-spaced and longitudinally extruded box channel members, stringers 106 and 108, open at their opposite longitudinal ends and designed to slidably receive a pair of fork tines of a commercially available forklift truck. As best seen in FIG. 2, a pair of longitudinally spaced apart and parallel box frame members, cross beams 110 and 112, are made up by a longitudinally-aligned array of open-ended shorter box section channels 114, 116, and 118, registering with mating openings (not seen) in box beams 106 and likewise as to box beam 108. The outer front and rear sides of the pallet construction are formed by C-section steel channels, such as front channel 120 seen in FIG. 2, and on the opposite side of the pallet by C-section steel channels 122, 124, and 126 (FIGS. 1, 2, and 4). The opposite longitudinal ends of the pallet framework are made up of C-section channels 130, 132, and 134. C-section channel 130 is welded at its ends to the box section upright corner post 136 and at the other end to the side of stringer 106 adjacent its open end. Likewise C-section channel 132 is welded at its opposite longitudinal ends respectively to stringers 106 and 108 adjacent their open ends, and channel 134 is likewise welded to stringer 108 and upright corner post 140.

Stringer beams 106 and 108 provide at each of their opposite longitudinal ends, a pair of rectangular-shaped openings 107, 109 for receiving conjointly, respectively, the two conventional tines of a forklift mounted on the upright mast rails of a conventional forklift truck. Likewise, the opposite open ends of cross-beams 110 and 112 are designed to individually receive respective forklift tines of a conventional forklift truck (such as forklift truck 601 in FIG. 14).

The palletizing panel-locating function of pallet jig 100 is served by a series of upright channel posts disposed along the back of the opposite longitudinal ends of pallet jig 100 and along the rear side of pallet jig 100. The upright channel posts are also clearly seen and described in connection with FIGS. 11a, 11b, and 11c.

The primary jig post components, as shown in the aforementioned figures, include upright jig support and panel positioning posts arranged in pairs, illustratively, end support uprights 150, 152 and 154, 157, one pair being located at each of the longitudinally opposite ends 105 and 115 of pallet jig 100, along with corner support posts 158a and 158b. Pallet end support uprights 150 and 152, for example, are both mounted at their bottom ends on a pivoting channel and sliding plate sub-assembly 170 shown separately in FIG. 3. Sub-assembly 170 is a pivoting hinge beam that includes an inverted C-channel beam 171, slide plate 172 and draw latch assemblies 190 and 192.

Figure 3:
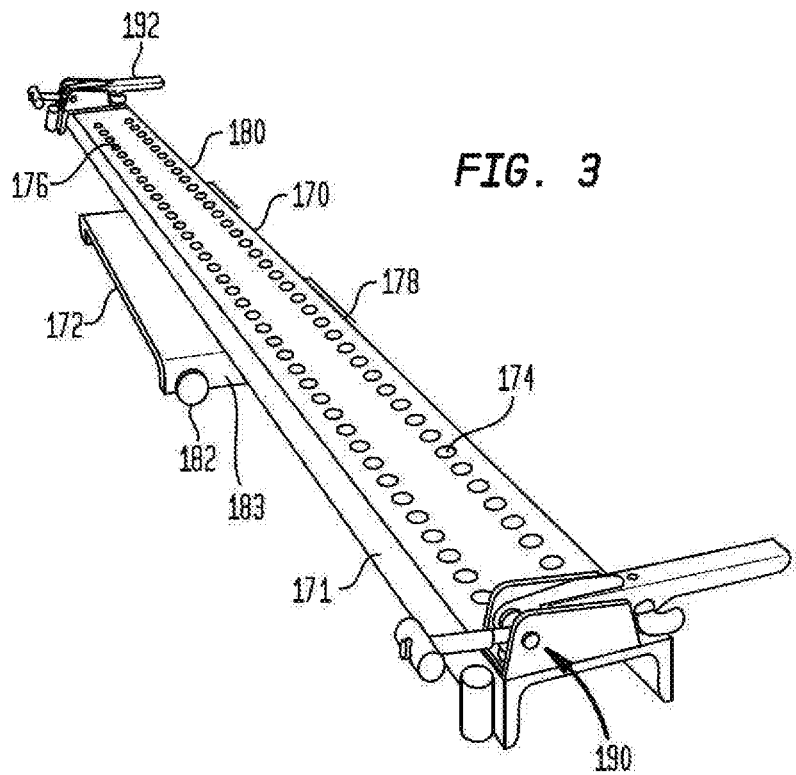
FIG. 3 is a perspective view of a sub-assembly of a roller-mounted movable support plate with a pivotable jig support channel bar hinge-coupled to the movable plate, and carrying at each end an adjustable draw latch, the sub-assembly is also shown pallet-mounted in FIG. 2.

As best seen in FIGS. 2 and 3, pivoting channel and sliding plate sub-assembly 170 comprises an inverted C-channel beam 171 provided with laterally spaced and longitudinally extending rows 174 and 176 of mounting bolt holes. Pivoting hinge beam 170 when upright (e.g., FIGS. 2 and 3) rests on a centrally located slide plate 172 and is hingedly coupled thereto by a pair of hinges 178 and 180 (FIGS. 2 and 3). Slide plate 172 has a pair of wheels 182 (only one wheel being seen in FIG. 3) rotatably mounted on down-turned side flanges 183 of slide plate 172 and tracking, in assembled condition, in associated wheel track channels 184 and 186, respectively, affixed to the mutually-facing inner sides of longitudinal pallet channels, or box section channel members, 108 and 106 as shown in FIG. 2. Pivoting hinge beam 170 is releaseably held to the pallet in a fixed position by a pair of adjustable draw latch assemblies 190 and 192 to thereby support and restrain associated jig pallet end upright support posts 150, 152, and 158a fixed in predetermined upright orientation.

Draw latch assembly 190 is shown in detail in FIG. 4. Referring to FIG. 4, a locating and latch block and V-groove receiver sub-assembly 194 comprises an upright mounting plate 196 affixed by bolts 198 and 200 registered by associated mounting holes in the web of channel 120. Mounting plate 196 has an upper extension 202 which supports mounting bolts 204 and 206 which thread into associated mounting holes in V-groove receiver 194 to securely affix the same to channel 120. Locating block 194 has a front side facing pallet end channel 130 with a vertically-extending V-groove 210 therein that serves as the locating receiver for a cylindrical pin 212 in the latched position of associated latch 190. Cylindrical locating pin 212 is welded to the outer face of the vertical flange 214 of pivot channel beam 170 and is drawn into seating engagement with the V-groove 210 of locating block 194 in the fully latched up condition of draw latch assembly 190 shown in FIG. 4.

Each adjustable draw latch 190 and 192, also comprises a U-shaped bracket member 220 having a pair of upright side flanges 222 and 224 held upright and spaced apart by an integral bottom web (not shown) that is welded to the upper surface of pivoting hinge beam 170 at the associated longitudinal end thereof. Adjustable draw latches 190 and 192 also include an inverted U-shaped latch receiver 226 having its center web welded to the upper face of locating block 194. Latch receiver 226 serves as a receiver locking catch for cylindrical latch pin 230. The upper edges of the upright sides of latch receiver 226 are configured to provide sliding support for cylindrical latch pin 230 in the latching and unlatching operating conditions thereof, and also to provide stop latch surfaces of semi-circular configuration to releaseably hold latch pin 230 in securely locked position when drawn thereagainst by swinging pivot handle 240. Draw latch 190 includes a draw rod 232 that is externally threaded for threadably engaging an internally threaded through hole in latch pin 230 such that latch pin 230, in unlatched condition, can be threadably adjusted along draw rod 232. The end of draw rod 232 opposite pin 230 has a cross pin 234 that is pivotably mounted by being received in associated mounting holes in flanges 222 and 224. Cross pin 234 thus serves as a pivot pin for draw rod 232 as well as a mounting pin for the pivot handle 240 of adjustable draw latch 190.

Flanges 222 and 224 of latch assembly 190 have their upper edges configured to provide a draw cam action in cooperation with a cam follower bracket 242 (FIG. 4). Follower bracket 242 has a horizontal cross piece 244 extending between and through associated slots provided in the pair of down-turned flanges of pivot handle 240. The cam follower edges of cam follower latch bracket 242 are configured to slidably ride on down-sloping and latch-configured camming edges 246 of each mounting bracket 220 as to thereby function as a draw latch arm.

Draw latch assemblies 190 and 192 are fixedly mounted one each at the opposite longitudinal ends of pivoting hinge beam 170 as shown in FIGS. 1 to 3. When latch assemblies 190 and 192 are unlatched by pivotably raising their associated latch operating arms 240 to thereby disengage latching pins 230 from locking brackets 226. Inverted C-channel beam 171, along with upright post supports 150, 152, and 158a affixed upright thereon, can be pivoted outwardly about the rotational axis of the hinge pin connections 178 and 180 of channel beam 171 to slide plate 172, thereby removing associated end support channels 150 and 152 as well as corner support post 158 from their upright edge-engagement with the associated panelized modules 104 by allowing the uprights to be pivoted down to rest on the ground. This release action frees up the panelized PV modules 104 and permits the panels to be removed more easily and safely from their position in the palletized stack-up.

Each of the pallet rear side support uprights and longitudinally opposite pallet end side support uprights, or jig posts, 150, 152, 158, 155, 156, 158b, 154 and 159, is mounted in a selected position with respect to its associated horizontal support beam member of pallet jig 100 by an associated mounting gusset 260 as seen in FIG. 2, only one of which will be described in detail. Gusset 260 comprises a U-shaped plate member having upright flanges 264 and 268 flanking its center web 265. Gusset center web 265 is seated flat and bolted to an associated horizontal pallet frame member, which in this case is C-channel beam 171 of pivoting hinge beam 170. Jig post 150 is selectively adjustably located longitudinally of pivoting hinge beam 170 by selecting the appropriate mounting bolt hole registry for a mounting bolt 262 having its head seated on the gusset center web 265 and its threaded shank extending through the selected bolt hole in the row of holes on C-channel beam 170. The triangularly-shaped upright attachment flanges 264 and 266 of gusset 260 flank the opposite sides of the associated channel flanges of its associated upright jig post 150 and are welded thereto.

The two rear upright support posts 155 and 156 are likewise mounted to the pallet by associated gussets of like construction to gusset 260 and are likewise bolted in longitudinally adjustable positions by associated mounting bolts that extend one through the center web of the associated gusset. The gusset of each rear support posts 155 and 156 is bolted to the selected bolt hole in a row of bolt holes provided in a mounting channel 157 (FIG. 2) fixedly and non-pivotally carried by associated pallet frame members at the rear side of pallet jig 100.

Preferably, the pair of pivotal end support upright posts 150 and 152, and likewise the pair of pivotal end support upright posts 154 and 157 that are located at the respectively associated opposite longitudinal ends of pallet jig 100 are provided with a pair of associated horizontal spreader bars 151 and 153 (FIGS. 1, 2 and 11). These spreader bars are in the form of C-channels wherein the center web, at opposite longitudinal ends of each spreader bar, are folded in and welded to the associated mutually facing sides of end support upright posts 150 and 152, and likewise as to a pair of spreader bars 151' and 153' welded to end support upright posts 154 and 157 at the opposite longitudinal ends of pallet jig 100.

Figure 6:
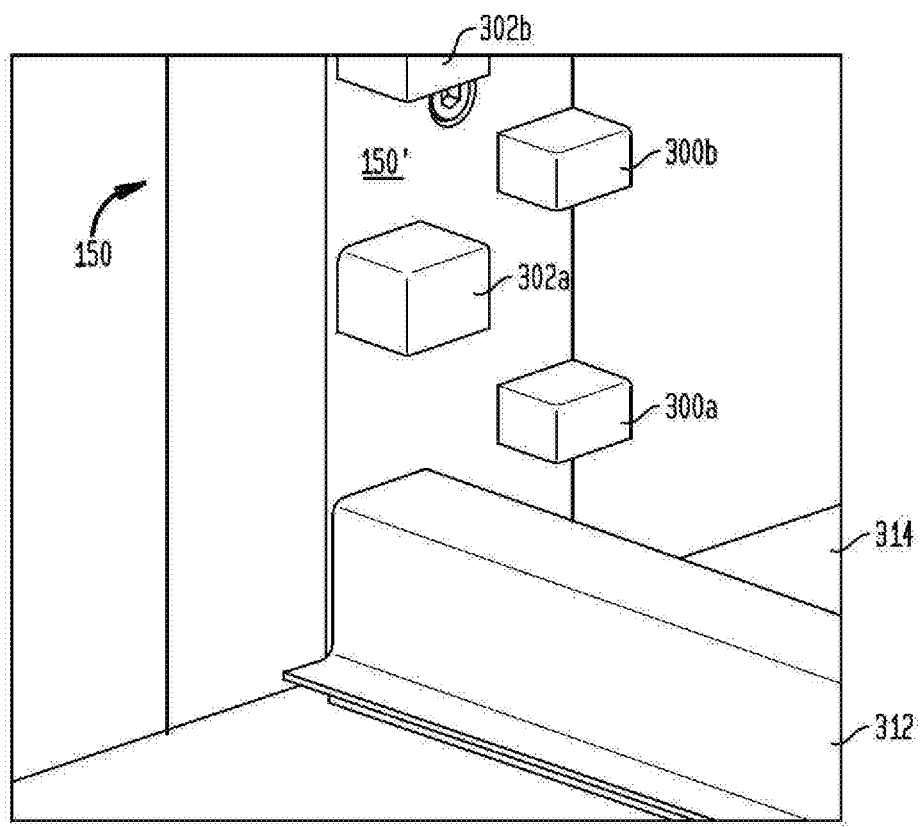
FIG. 6 is a fragmentary perspective view illustrating a portion of a jig locating and lug support strip affixed to and carried by one of the pallet jig upright support posts, the strip having protruding positioning lugs for supporting and positioning respective PV glass panels with their associated support rails as each PV module is being assembled upside down and stacked during pallet loading in the inverted panel stack-up panelization process and that provides the predetermined orientation in the inverted pallet jig stack-up array as shown in FIG. 1.
Figure 7:
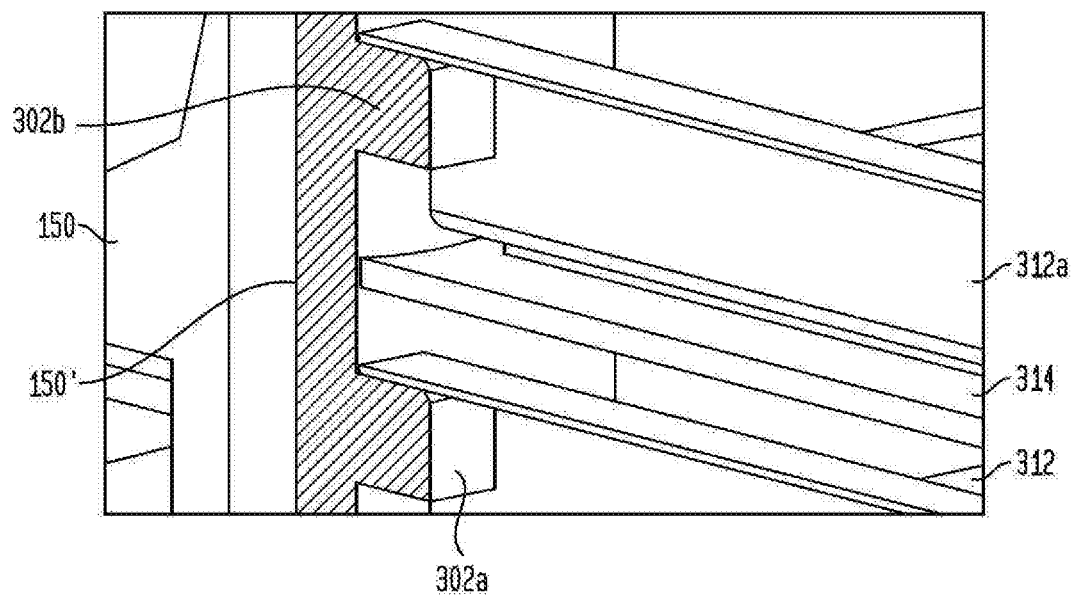
FIG. 7 is fragmentary perspective view, with portions shown in cross-section, further illustrating the relationship of a PV panel and associated support rails with the jig lugs of FIG. 6.

Referring again to FIGS. 1 and 2, and in more detail to FIGS. 6 and 7, each of the upright posts 150, 152, 154, 155, 156, 158*a*, and 158*b* is provided with an associated jig strip (best seen in FIGS. 2 and 11 and fragmentarily in FIGS. 6 and 7). Each of these jig strips is identified by the reference numeral of the associated upright support post as raised by a prime suffix, in FIGS. 1, 2, 6, and 7. Preferably, jig strips 150' through 158*b*' are machined to provide a one-piece finished part that is adhesively, or otherwise, securely affixed with its smooth backside against the inwardly facing surface of its respectively associated upright support post. As seen by way of example in FIGS. 6 and 7, the surface of the base of jig strip 150' that faces inwardly toward the panelization zone of pallet jig 100 is provided with protruding support and positioning projections, or lugs, 302*a* and 302*b*, arranged in a spaced apart vertical row and designed to position and support an associated PV panel rail in its proper position for the palletization process. Another vertical row of spaced apart lugs 300*a*, 300*b*, etc. are each positioned and designed to edge-support an associated PV panel during the panelization process, as described hereinafter, and with the panel edge supported at the desired height to insure uniform adhesive bead thickness.

Figure 12:
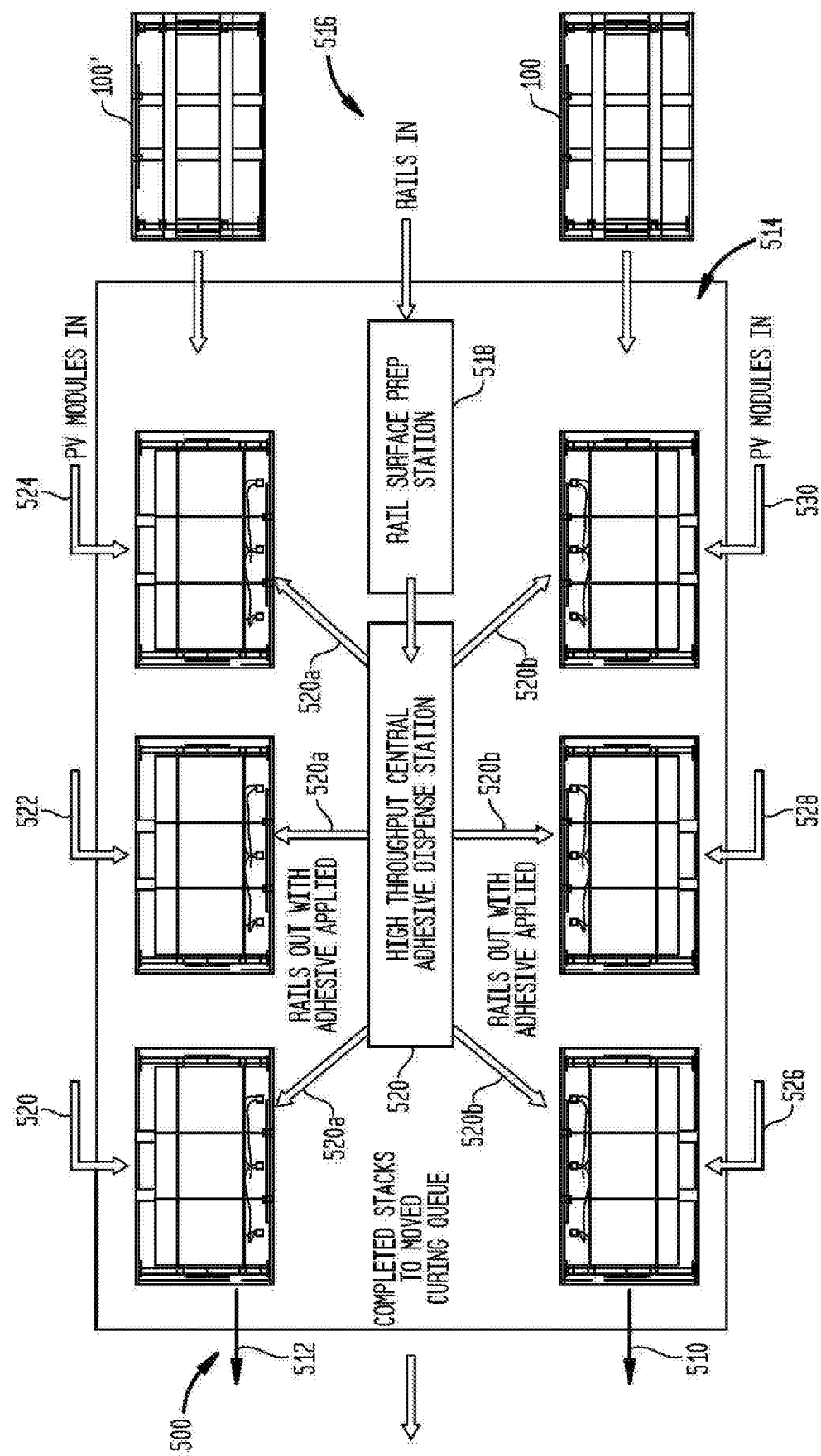
FIG. 12 is a diagrammatic plan view of a PV solar panelization work center in accordance with the invention which illustrates material flow and labor stages in a factory-like environment, preferably located near the ground support rail racks field array installation, and the processing steps involved in preparing the PV solar panel modules oriented inverted and upside-down, or with their shady-side-up, or conversely, sunny-side-down, in the stack-up array of FIG. 1.

The panelization process of the invention is best understood by viewing the assembly sequence shown in FIGS. 11*a*, 11*b*, and 11*c*, in conjunction with the panelization work center material flow diagram of FIG. 12, all to be read further in conjunction with the details in FIGS. 5-10.

It should be understood that each PV solar panel module build-up starts with constructing a PV solar panel module, such as that shown in FIG. 13, while its components are being sequentially supported on pallet jig 100 in an inverted, or upside down, relationship relative to their final operational orientation when later field-mounted on a rack of a solar panel array, illustratively of the type disclosed in co-pending U.S. Ser. No. 13/553,795, published on Jan. 24, 2013 as US-2013-0019925-A1.

Figure 13:
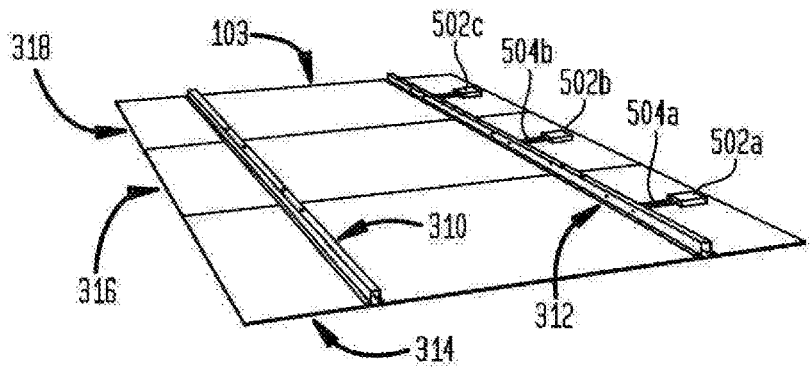
FIG. 13 is a perspective view of an assembled PV solar panel module, shown shady-side-up and by itself.

Referring first to FIG. 13, each panelized PV solar panel module includes, when completed, two parallel support rails 310 and 312 of identical construction that are adhesively affixed to, and transversely span, the downwardly facing bottom surfaces of two or more panels comprising a panel module. In this specific embodiment, three closely laterally-spaced coplanar PV panels 314, 316, and 318 are employed. PV solar panel module 103 is assembled in inverted condition (bottom-side-up) to form a jig-positioned, stack-up of such panels in forklift compatible pallet jig 100.

Figure 5:
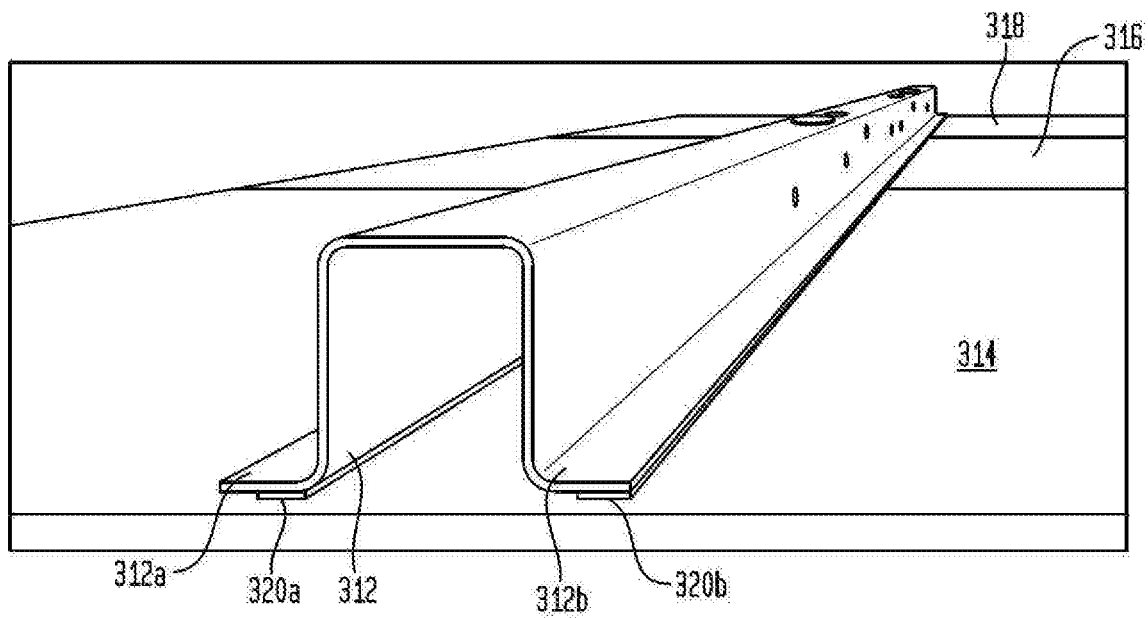
FIG. 5 is a fragmentary perspective sub-assembly view of one of the thin-gauge steel rails (in the form of a hat-style channel) secured by dual beads of a commercially-available adhesive to the underside surface of a PV panel module during the pallet-jig panelization process of the present invention.

Referring now to FIG. 5, rails 310 and 312 are each preferably a thin gauge steel rail. Although it is to be understood that each rail 310 and 312 can be provided as a single flange or an I-beam section style, the hat section, double brim style channel configuration shown in FIG. 5 is presently preferred inasmuch as it provides better stability and section strength. Each rail 310 and 312 is adhesively affixed to, and spans a laterally-orientated, coplanar array of PV panels 314, 316, and 318 (FIG. 13). Referring to FIG. 5, each of the integral rail brim flanges 312*a* and 312*b* carry on their panel-facing sides a single adhesive bead 320*a* and 320*b*, respectively. The adhesive beads 320*a* and 320*b* are preferably formed of commercially-available adhesives, such as Dow Corning PV-8303 with the bead size being determined pursuant to the manufacturer's recommendation, just prior to installation in pallet jig 100.

Referring to FIGS. 11*a*, 11*b*, 11*c*, and 12, adhesive beads 320*a* and 320*b* are first applied to the associated rail flanges 312*a* and 312*b* by specifically designed machinery 520 operable in panelization work center 500 as seen in the material flow diagram of FIG. 12. By way of example, each adhesive bead 320*a* and 320*b* is preferably 3 mm thick and 9 mm wide in its cross-sectional dimensions as applied by machinery 520.

Referring back to FIGS. 6 and 7, for example, it is to be understood that the vertical row of rail-support and positioning lugs 302*a*, 302*b*, etc. are designed to hold the associated rail 312, with the applied adhesive beads, with an appropriate contact pressure for the adhesive beads against the jig-oriented, upwardly-facing operable under-surface of the associated PV glass panel. Likewise the vertical row of panel support and positioning lugs 300*a*, 300*b*, etc. are vertically spaced apart and oriented to support the associated PV glass panel, resting thereon, at the desired height to assure uniform adhesive bead thickness.

In the embodiment shown in FIG. 7, the rail support and positioning lugs 302*a*, 302*b*, etc. are designed to hold the associated rail 312 and 312*a*, the appropriate distance above the associated PV glass and are dimensioned to have a relatively small clearance against the associated rail 312 and 312*a* to keep the rail from twisting when assembled thereon in the final jigged position. The distance between rail holding jig lugs 302*a*, 302*b* is just sufficient to allow the next rail to slide in with a slight twisting motion.

Figure 9:
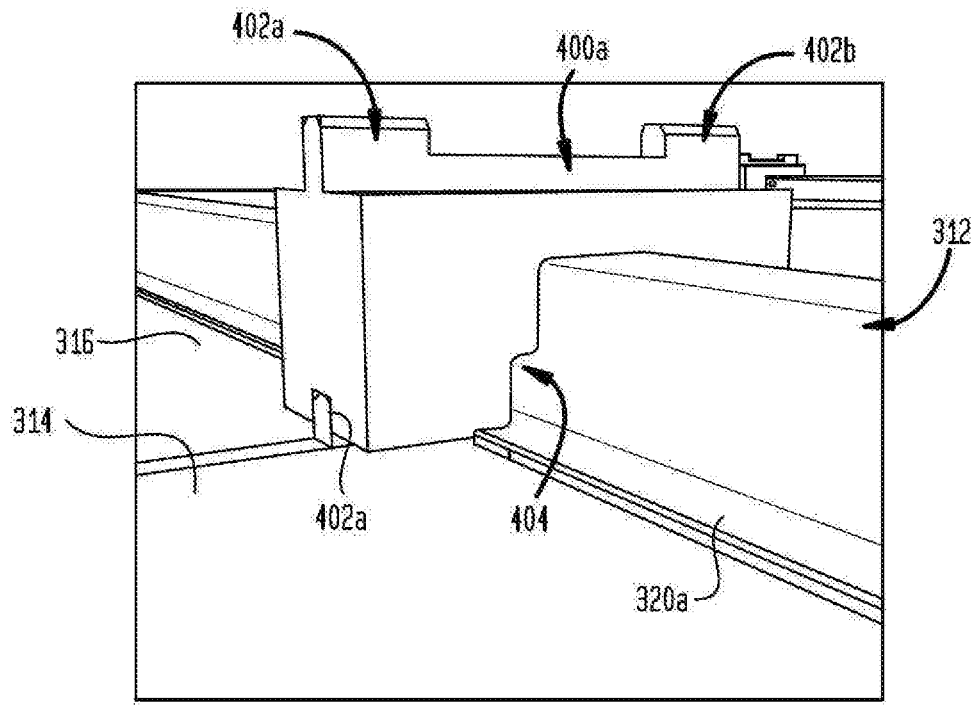
FIG. 9 is a fragmentary perspective view of a support, or stacking, block, also termed herein as a spacer block, assembled at a defined position on a support rail which in turn is adhesively affixed to an underlying PV module while the same is upside down and in the uppermost exposed position in the panelization stack-up process.

Referring to FIG. 9, a single stacking block 400*a* is shown installed on associated rail 312. Each stacking block can be formed as a one-piece plastic block that is machined or precision injection molded to the configuration shown in FIG. 9 and in cross section in FIG. 10. All stacking blocks 400, 400a, 400b, etc. in contact with a frameless PV glass panel, or module, are preferably made of plastic, illustratively urethane foam, or another relatively soft material, so as to minimize risk of damaging the PV glass of the module array.

Figure 10:
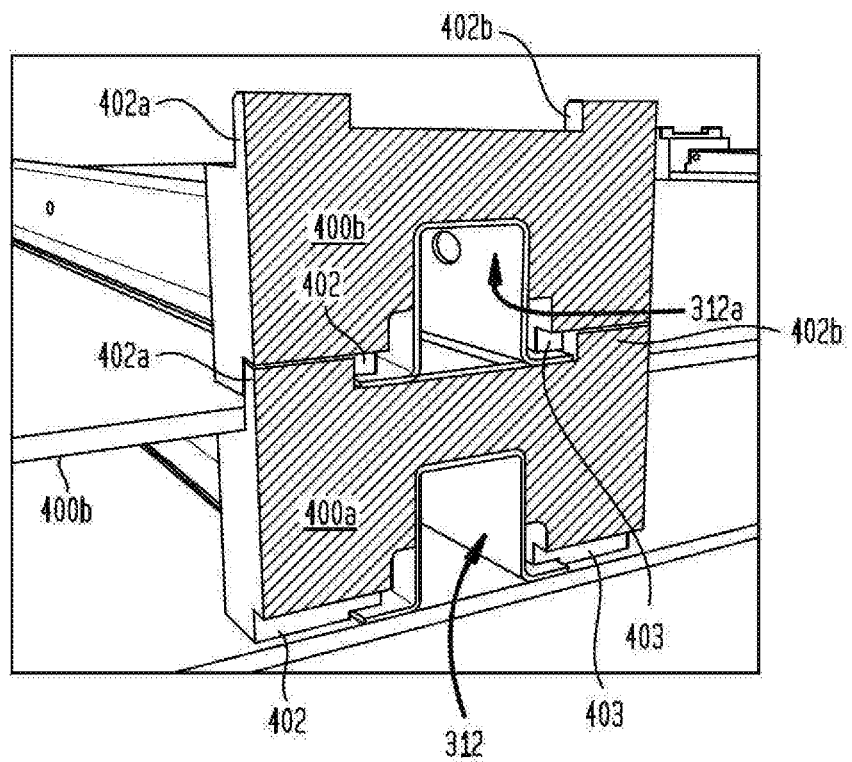
FIG. 10 is a fragmentary perspective view of two registered spacer blocks and associated PV glass panels, with the blocks being shown in half-section in assembled relationship to one another and associated rails and PV glass panels during the panelization process.

FIG. 10 illustrates two identical stacking blocks, or spacers, 400a and 400b, in cross section, slidably received in vertical registry with one another on the hat section portions of associated rails 312 and 312a. The stacking blocks are dimensioned so that the weight of the PV module stack-up 102, as seen in FIG. 1, is transmitted though the associated stacking blocks and rails so that no load support stress is placed on a PV glass layer in the panelization jig stack-up 102. In addition, one or more spacers, suitably located between PV glass layers, may be required to maintain uniform thickness of the adhesive beads across the panel and to preserve the quality of the adhesive beads.

In FIG. 10, two identical stacking blocks 400a and 400b are shown in assembled condition with associated rails 312 and 312a, respectively, each block being shown in central half section. As shown in assembling step FIG. 11c, four stacking blocks 400a, etc. are c-rail installed at rail-block positions numbered 406, 408, 410 and 412 per PV module, and as so installed, each stacking block has tang receiving slot portions 402 and 403 on its underside to receive block tangs 402a and 402b respectively and thereby ensure subjacent repeatable lateral spacing gaps between adjacent glass panels, such as panels 314 and 316 shown in FIG. 9. Such spacing is particularly helpful in preventing damage to adjacent longitudinal solar panel edges as they flex and vibrate during truck lift transport described hereinafter. This is especially beneficial when dealing with "frameless" solar panel modules. Each stacking block is provided with a notch 404 (FIG. 9) to provide a gap between the stacking block and adjacent vertical side of the rail to thereby form a suitable passage way for accommodating the DC wiring loads installed in the stack-up assembly step of FIG. 11a.

FIGS. 11a, 11b, and 11c, diagrammatically and sequentially, illustrate the use of the PV assembly jig and forklift transport pallet 100 of the present invention to construct the stack-up 102 of inverted solar panels PV modules 104 as each is loaded upside-down (i.e., sunny-side-down) as shown in FIG. 1. Preferably, the empty pallet jig 100 is provided as starting material for use in the panelization work center 500 shown diagrammatically in FIG. 12. Preferably, work center 500 is established at a location spaced away from, but relatively close to, the site where the ground-supported array of solar panel racks is being constructed.

Panelization work center 500 is preferably a conventional, covered temporary construction-site-installed building (not shown) that provides relatively low cost protection against the weather, such as may be provided by a temporary quonset hut, or circus-tent type structure, so that the solar array construction equipment and materials can be securely, but temporarily stored therein, and solar panel construction labor can also be performed in the weather-protected environment so that such labor is eligible for the applicable factory labor rates which are significantly lower than the field labor rates of the relevant construction trades. Indoor construction conditions also reduce material damage and loss.

Referring further to diagrammatic FIGS. 11a, 11b, 11c, in conjunction with FIG. 12, note that, by way of example, panelization work station 500 is arranged with two parallel manual panelization assembly lines 510 and 512 mutually flanking a central rail prep line 516. Rail prep line 516 preferably provides rail surface prep and adhesive bead application equipment to provide an indoor supply of rails with adhesive applied to the flanges, as described above, for manual installation in the flanking panelization assembly lines 510 and 512.

Referring further to FIGS. 11a, 11b, and 11c, in that sequence, FIG. 11a shows the initial steps in constructing and pallet-assembling the bottommost solar panel module of a stack of such modules when forming the stack-up array 102 of inverted (i.e., sunny-side-down) modules seen in FIG. 1.

In FIG. 11a, three PV solar panels are shown installed side-by-side and so-oriented upside down and in a laterally-spaced array, ready for transport by fork lift truck, and removably supported in predetermined position by the associated solar panel support jig components of pallet jig 100. More particularly, PV solar panel 314, for example, is supported in horizontal orientation, bottom side up, on end support upright posts 150 and 152 by its panel edges resting on their associated jig lugs, such as lug 300a, more clearly seen in FIG. 6, which are provided on end support upright posts 150 and 152. In this figure, pivoting end support upright posts 150 and 152 are shown locked to their vertical orientation by latches the associated pallet draw latch assemblies 190 and 192. Likewise, the rear right-hand corner of panel 314, as viewed in FIG. 11a, is held horizontally-oriented while resting on its associated corner jig lug on upright corner support post 158b.

The left-hand longitudinal edge of bottommost panel 314 rests on pallet frame channel sections 114, 116, and 118 (FIG. 2) in lateral closely-spaced relation with the right hand longitudinal pallet edge of center panel 316. Panel 316 in turn also rests on and is supported by pallet channels 114, 116, and 118. The left-hand longitudinal edge of center panel 316 is closely spaced from the right-hand longitudinal edge of panel 318, and those longitudinal edges are both supported on pallet channel 110. The rear corner of panel 314 rests upon and is horizontally positioned by an associated jig lug on upright corner support post 158b.

The mutually-facing parallel longitudinal edges of panels 314 and 316 are closely spaced and held parallel to one another by their jig fixturing on pallet jig 100. Likewise, the closely spaced mutually-facing parallel longitudinal edges of panels 316 and 318 rest on sectional pallet frame channel 110. Panel 318, at its rear left-hand corner, rests on on associated jig lugs on rear corner upright post 158a. The left-hand longitudinal edge of panel 318 rests on associated jig lugs on end support upright posts 154 and 157.

When PV solar panels 314, 316, and 318 are so-assembled and thereby releasably supported in a single layer so as to form the bottommost PV solar panel module 103 in stack-up array 102 (FIG. 1), they are pallet jig oriented as PV module components located at predetermined x, y, and z, datum points, on and relevant to, associated support components of pallet 100. Thus, the PV solar panel component of the bottommost layer of the pallet stack-up 102 (FIGS. 1 and 2) is positioned at a predetermined x,y,z, location on pallet jig 100, albeit in an upside down or inverted (sunny-side-down) condition relative to their final operational orientation (sunny-side-up) when finally operationally installed in a PV solar panel field array.

Figure 8:
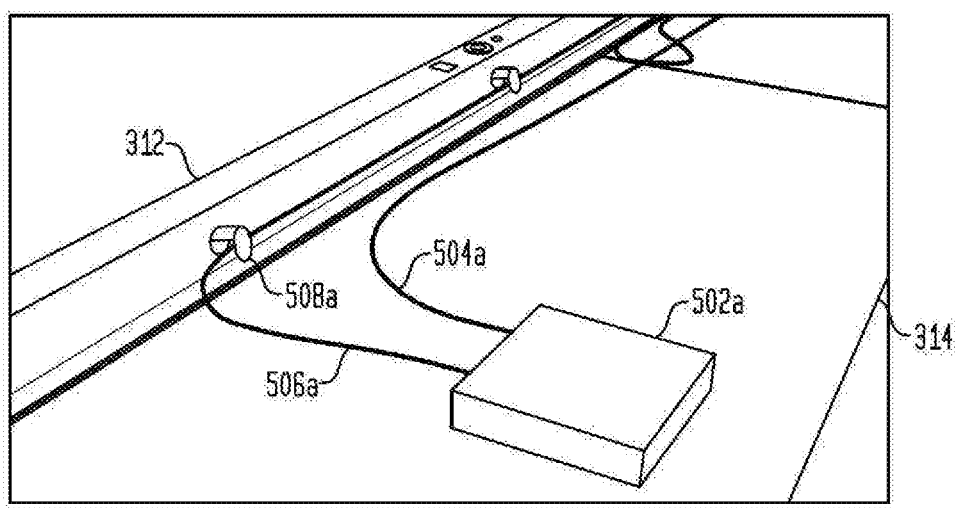
FIG. 8 is a fragmentary perspective view of an uppermost layer in the panelization jig pallet stack-up illustrating installation of wiring and other electrical components to the uppermost inverted panelization layer during the panelization assembly process of FIG. 11a employed in making the pallet jig stack-up of FIG. 1.

Referring to FIGS. 11a to 11c, following manual installation of module support rails 310 and 312, as shown in FIG. 11b, the next step in the assembly of stack-up 102 is to install commercially-available panel DC wiring and wire management components, such as electrical components 502a, 504a, 506a and 508a, as partially shown in FIG. 8. The majority of such DC wiring and wire management components are manually installed, with cable ties being used to manually dress the DC wiring, both intra-panel and inter-panel, to the underside surfaces of the three panel array 314, 316, and 318. The manual labor installation work is greatly facilitated by the upwardly facing inverted orientation of the panels. However, the DC wiring must be restrained prior to the panel module being transported by the automated installation equipment as described hereinafter.

The next step in the construction of the solar panel module comprising PV panels 314-318 is shown in FIG. 11*b*. Rails 310 and 312 are manually attached. Referring to FIG. 12, adhesive beads 320*a* and 320*b* (FIG. 5) are applied to the rails at the central adhesive dispensing station 520 in work center 500. The panels are likewise oriented upside-down as manually assembled in their predetermined positions and orientation spanning panels 314, 316, and 318, and with their associated adhesive beads 320*a* and 320*b* contacting the respectively upwardly facing bottom surfaces of inverted PV panels 314, 316, and 318. Rails 310 and 312 are also inverted as installed and rest at their ends in the associated jig lugs as partially shown in FIGS. 6 and 7.

Referring to FIG. 11*c*, the next and last step in completing "in jig" the lowermost solar panel module assembly is to install the set of four removable stacking blocks 400 designated in FIG. 11*c* as stacking blocks 406, 408, 410, and 412. Each of these blocks is identical to one another and to the installed stacking blocks 400*a* and 400*b* as shown in FIGS. 9 and 10. Stacking blocks 406 and 410 are assembled on their respective rails 310 and 312 so that their bottom projections 402*a* (FIG. 9) fit in the gap between the mutually facing longitudinal edges of panels 316 and 318. Likewise, stacking blocks 408 and 412 have their bottom projections 402*a* disposed the gap between the mutually facing longitudinal edges of panels 314 and 316. Stacking blocks 408 and 412 are removably seated on associated rails 310 and 312 such that their bottom protrusions 402*a* likewise defines the gap between the longitudinally extending and mutually facing edges of panels 316 and 314. The x, y, z datum in the dimensions of the stacking blocks are predetermined by the associated pallet jig and positioning lug orientations provided for the single bottom layer assembly of FIG. 11*c*. The stacking blocks also provide a gap to control the vertical distance between the associated rails 310 and 312 and the back of the associated panel, i.e., the thickness of the adhesive beads 320*a* and 320*b*, as shown in FIG. 5.

The solar module positioning and assembly steps described above in conjunction with FIGS. 11*a*, 11*b*, and 11*c*, complete the bottommost layer of the PV module stack-up 102 of FIG. 1. Note that the x,y,z datum points for this module assembly are predetermined relative to the features of the pallet jig 100 as described hereinabove in conjunction with FIGS. 1-10. The sequential steps of the assembly cycle of FIGS. 11*a*, 11*b*, and 11*c* are repeated with respect to constructing and assembling the next solar assembly module as superimposed sunny side down on top of the bottommost module 103. These steps further include installing removable and reusable slip-fit stacking blocks 406, 418, 410, and 412, accurately positioned and located on their associated rails 310, 312, for serving their final operative use as damage prevention to the panel stack-up 102 during lift truck delivery to the field array of solar panels.

Referring specifically to panelization work center 500 shown diagrammatically in the flow diagram of FIG. 12. Work center 500 is made large enough to prepare the completed PV assembly jig and forklift transport pallets, shown in FIG. 1 as pallet jig 100, and by way of example, may comprise at least two assembly lines 510 and 512. Empty pallet jigs 100 and 110 are returned from their field-emptying cycle and fed as recycling starting input to assembly lines 510 and 512 shown schematically in FIG. 12.

Preferably work center 500 is constructed as a temporary warehouse or portable factory, to provide a weather-protected covered and firm surface work platform, such as a concrete floor pad represented diagrammatically as pad 514 in FIG. 12. Hence, the manually-performed assembly steps in the construction of pallet jigged stack-ups 102 of inverted solar panel modules 104 is efficiently completed by manual labor and production equipment that are sheltered in panelization work center 500. In FIG. 12, a series of empty pallet jigs 100 are shown entering assembly line row 510, and empty pallet jigs 110' are shown entering the duplicate assembly line row 512. The two assembly lines 510 and 512 are spaced apart to accommodate central processing line 516 for surface preparation and application of adhesive to support rails 310 and 312 for sequential assembly as described herein to each layer of PV modules 104 in the jig pallets 100, 100', and so on, as provided to assembly lines 510 and 512.

The central rail supply line 516 of workstation 500 includes a rail surface preparatory station 518 and a centrally located adhesive dispensing station 520 that receives the output of panel rails upstream from surface prep station 518 and applies the adhesive beads 320*a* and 320*b* to the rail hat brim flanges 312*a*, and 312*b*, described in conjunction with FIG. 5. In the embodiment shown, central adhesive dispensing station 520 has two sets 520*a* and 520*b* of three duplicate output stages arrayed one set on each of the longitudinal sides of dispensing station 520 to thereby provide the appropriate output of rails from the central station 520 with adhesive beads applied to the rail hat flanges. The rails are manually retrieved from central station output and assembled with and affixedly applied to the upwardly facing bottom surface of inverted PV panels in the manner described in conjunction with FIG. 11*b*.

The pallet-jig PV panel assembly stations 519, 522, 524 and 526, 528, 530 provided respectively in each of the panelization assembly lines 510 and 512 complete a palletized and jig-oriented respective stack-up 102 (FIG. 1) for fork lift transport. The assembly steps of FIGS. 11*a*, 11*b*, and 11*c* are repetitively performed on and in each of the pallet jigs 100, as shown diagrammatically in FIG. 12 by the right-angle assembly arrows 519, 522, and 524 of assembly line 512, and likewise diagrammatically shown by the right angle assembly arrows 526, 528, and 530 of assembly line 510. These completely assembled PV module stack-ups 102 are then fork lift truck transported from the final stage of assembly lines 510 and 512 to an input queue at a covered adhesive curing station (not shown). Thus, the assemblies are protected from weather, and also if needed, simultaneously heated to assist curing of the adhesive beads and consequent adhesion of the rails to the associated PV module panels.

Figure 15:
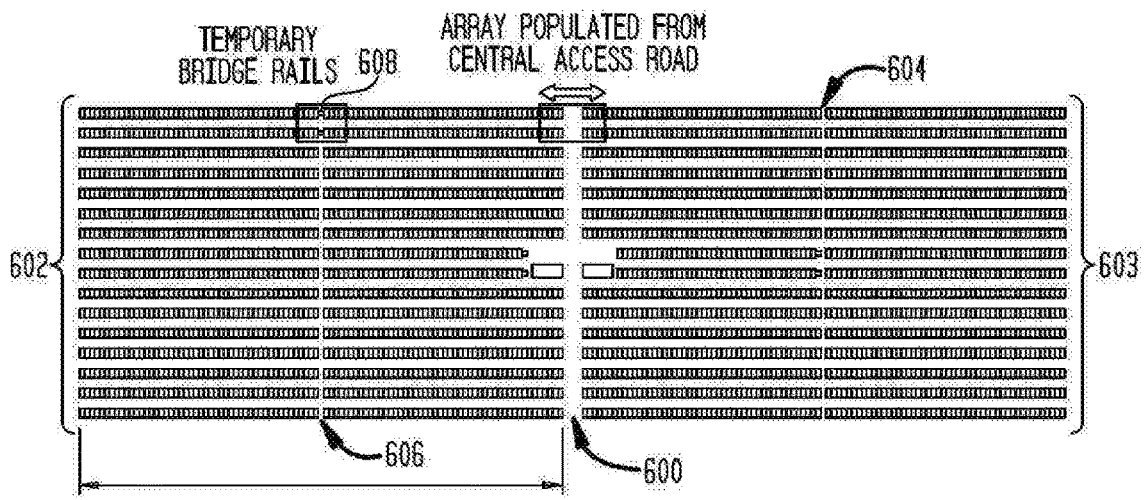
FIG. 15 is a diagrammatic plan view illustrating an entire rail-rack-supported field array of solar panel PV modules as drone-populated from a central logistics area.

Referring to FIG. 15, using a system such as that disclosed in co-pending U.S. Ser. No. 13/553,795, entire PV solar panel rail rack arrays 602 and 603 can be populated from a central logistics area. Typically, this area will be a permanent service or fire access road 600 as seen in FIG. 15 and which is already included in the site plan as shown diagrammatically in the solar panel rail rack arrays 602 and 603. Aisle breaks 604 and 606 in the arrays 603 and 602, respectively, can be bridged with temporary rails indicated schematically at 608, thereby extending the solar panel field area that is reachable from a single logistics area for installation of the PV solar panels by automated drones 902, as described and shown in the aforementioned co-pending patent application.

Figure 14:
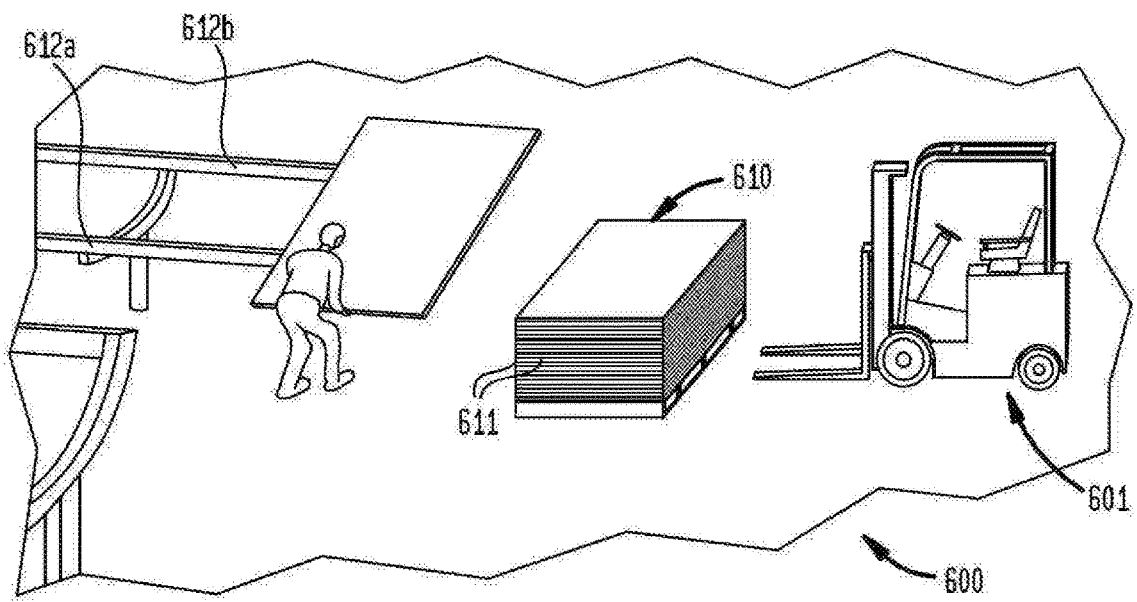
FIG. 14 is a perspective view of one system embodiment of solar panel modules having been delivered in a conventional sunny-side-up, non-jigged stack-up to the rack loading station by a forklift truck, and being manually placed on the rack loading station by a two-man crew.

FIG. 14 illustrates a stack-up 610 of PV solar panel modules 611 oriented sunny-side-up and unrestrained while being delivered by fork lift truck 601 and manually off-loaded to provide a ground-supported stack 610 of panels 611 in accordance with the prior art. Also in accordance with the prior art, after having been delivered by a fork lift truck, the individual solar panels 611 are manually off-loaded from the ground-supported stack-up 610 and then individually carried manually, or by specially-equipped rough terrain trucks, between adjacent rack rows until reaching their final individual operational position on the support rack.

FIG. 14 also illustrates a stack-up 610 of solar panel PV modules oriented right-side up in stack 610 in accordance with the prior art, and to be manually lifted and placed one at a time by a two man installation team on drone-equipped support rails of a system constructed in accordance with the aforementioned co-pending application. This drone-equipped rack array system, in conjunction with the PV assembly jig and forklift transport pallet of the present invention, can save hundreds of hours of service time in constructing solar panel arrays, as well as the time and cost of staging modules around the array field, and the subsequent trash retrieval cost. By using the railed rack arrays and automated robotic drones to carrying and place PV solar panels on the racks to form the solar panel array, a small team of people can install a megawatt (MW) of solar panels per day, approximately 20 times faster than an equivalent number of laborers manually installing PV solar panel modules in accordance with the prior art. The system of the invention can thus eliminate 95% of the automated PV panel carrier labor costs of installing PV solar panels.

Figure 16:
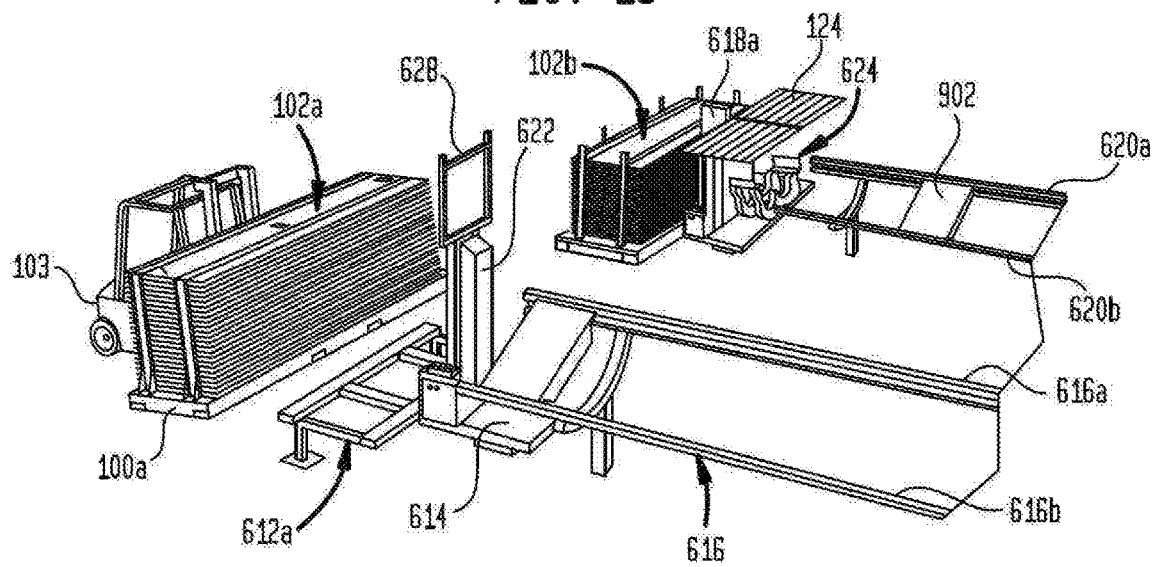
FIG. 16 is a perspective view of another embodiment of the step of successively individually robotically removing, and inverting to operable, or sunny-side-up, orientation, solar panel modules from two inverted, or sunny-side-down, stack-ups of finished solar panel modules, the stack-up in the foreground shown as being carried in an inverted module stack-up condition by a fork truck and in the forklift pallet jig assembly of FIG. 1, and the other stack-up being shown in the background, as having already been transported to, and seated by the fork lift truck, as an entire palletized stack, on a rack-loading entry platform station. At this station, the PV modules are robotically unloaded as, and when, they individually become the uppermost exposed sunny-side-up module on the stack.

FIG. 16 is a perspective overhead view that shows, by way of two side-by-side parallel field delivery and assembly lines, sequential stages in automated unloading and inverting of upside-down solar panels to a sunny side up orientation from panelization stack assemblies at panel unloading and transfer stations, each feeding PV panels to a given entry location of an associated dual rail rack support made in accordance with the invention. A stack-up load 102a of solar panel modules constructed and assembled on a pallet jig 100a, in the manner described previously herein in conjunction with FIGS. 1-12, is shown in FIG. 16 being carried on fork tines of a forklift truck 103 for deposit of the pallet-jigged load stack-up 102a onto the channel-type ground-mounted stationary load-receiving platform 612a. The accurate predetermined positioning of a pallet jig 100a on receiving platform 612a is designed to stationarily position stack-up 102a at fixed and predetermined x, y, z geographic datum points relative to operational engagement, transfer and release datum points of an associated robotic transfer station mechanism 614 positioned between platform 612a and the associated end-loading point of an associated rack rail installation 616.

FIG. 16 illustrates a neighboring palletized jig stack-up 102b, which is provided in a manner similar to stack-up 102a. Stack-up 102a is better seen in FIG. 17 after the same has been accurately deposited on, and supported by, an associated stationary support rack 612b constructed and positioned in the manner of support station 612a (FIG. 16). The stack-up 102b is also accurately positioned for cooperation with the associated robotic inverter/transfer station 618a that in turn is operably positioned relative to the feed-in end of the associated rail rack 620a and 620b.

Figure 17:
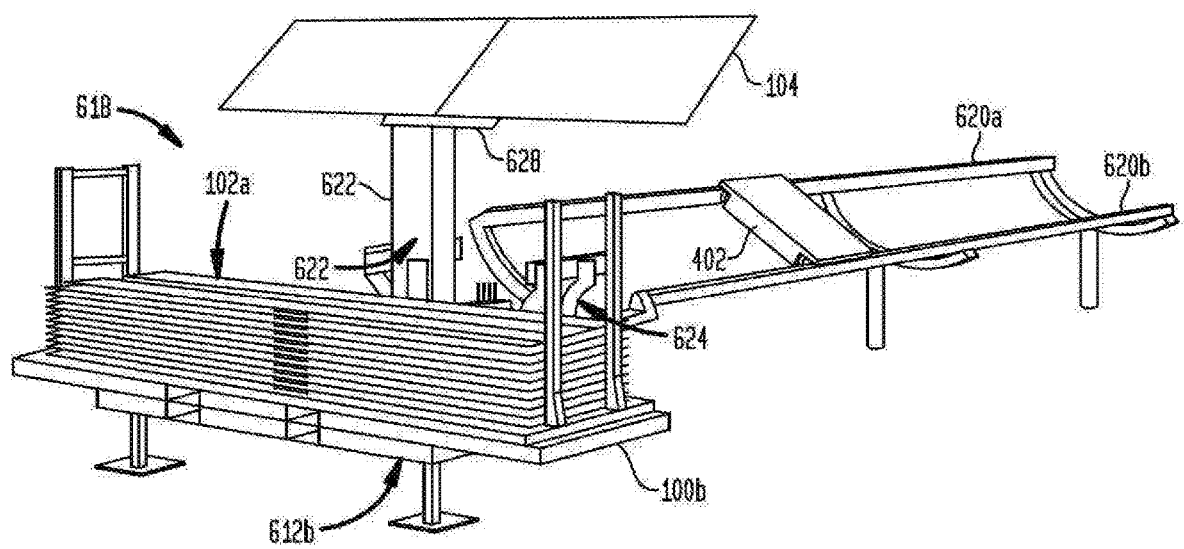
FIG. 17 is a perspective view showing the rack-loading station (shown uppermost in FIG. 16) Wherein the Automated Hydraulic Robot is Shown Holding a PV Panel Slightly beyond midway in the path of its transfer motion as the transfer robot is rotating the lifted panel about its longitudinal axis, and lowering it to bring it into upright orientation for disposition on the associated tilttable drone rack-loading station as shown in FIG. 16.
Figure 24:
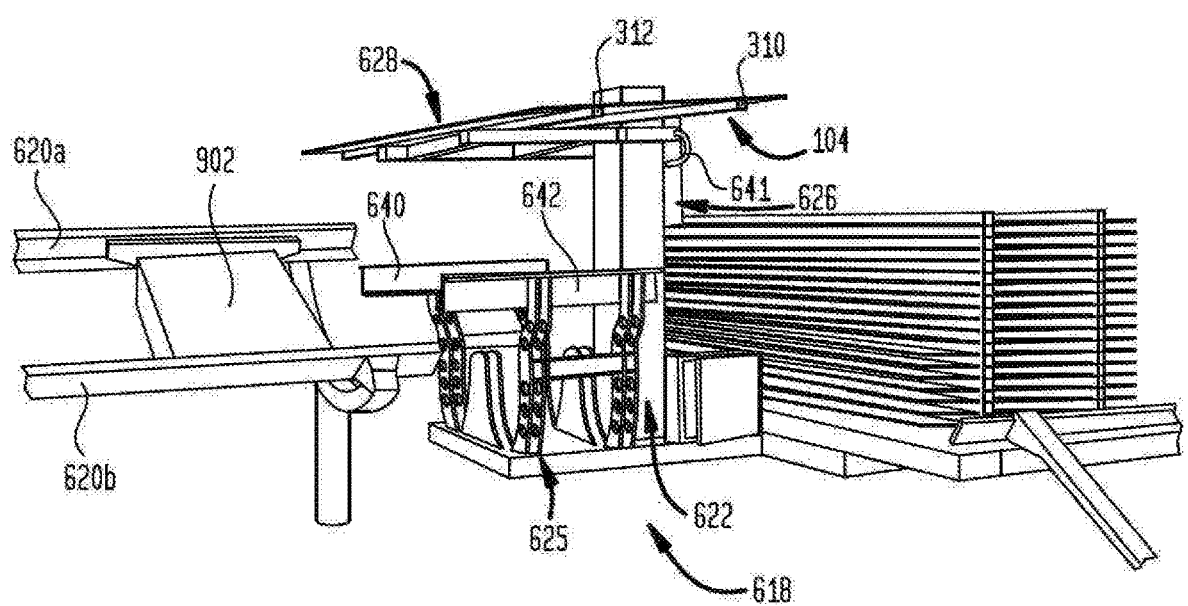
FIG. 24 is a fragmentary perspective view showing the panel transfer robot carrying a solar panel downwardly in the tilt rack loading portion of its operational cycle, with the robot panel carrier arm having inverted the solar panel to upright orientation and while lowering the same to be supported on top of tilt rails of the robotic drone-loading station.

FIGS. 22, 23, and 24, as well as the opposite side view in FIG. 17, illustrate the structure and operation of the robotic solar panel load inverter/transfer mechanism of transfer station 618 and of the duplicate mechanism of neighboring transfer station 614 as seen in FIG. 16. Transfer stations 618 and 614 each include an automated, hydraulically-actuated robotic carriage tower 622 shown stationarily mounted on channel framework platform 624 that in turn is secured at its entrance end to the associated ground supported loading platform 612b. Transfer robot tower 622 supports a combined hydraulic and chain-drive, computer controlled drive carriage 626 that is raised and lowered on an interior track of tower 622. Carriage 626 is located on the side of tower 622 facing oncoming PV solar panel load array stack-up 102b. Carriage 626 also pivotally supports a transfer carriage pivot arm assembly 628 see, as pivoted almost upright in FIG. 22.

Transfer carriage pivot arm 628 comprises a rectangular hollow beam box frame construction provided, as best shown in FIGS. * and *, with two sets of hydraulically-actuated panel rail grippers 529, located one pair each on the hollow longitudinally extending box frame carriage side member 630 and 632 that are in turn joined at their longitudinally opposite ends by carriage cross frame members 634 and 636 (FIG. 22). A pair of laterally-spaced transfer carriage support arms 640 are affixed at their outer ends to the closet crossbar 636 of carriage arm 628. Gripper support arms 640 straddle carriage 626 and, at their lower ends, are pivotally supported on carriage 626. Gripper actuating hydraulic lines 641 are trained from carriage 626 via hollow arms 640 and into the hollow side arms 632 and 634 of gripper 629.

Each of the solar panel transfer stations 614 and 618 also includes a tilttable platform station mechanism located between its associated robot transfer tower 622 and the loading/unloading ends of the associated dual rack rails of solar panel support racks. As best seen in FIGS. 22 and 23, platform tilt mechanism 624 is made up of a laterally-spaced apart pair of parallel Z-section channel rail platform members 650 and 652. Tilt platform rails 650 and 652 are carried on the upper ends of a rocker framework * of generally U-shaped configuration. Rocker platform frame arms * and *** (FIGS. 22 and 23) carry platform rail members 640 and 642, normally horizontal, mounted to and spanning the upper ends of frame arms 656 and 658.

The entire platform framework 650 is rockingly supported by a pair of upright U-shaped stanchion-rocker arm assemblies, located at and supported midpoints of stationary rocker platform 624. Each stanchion assembly comprises a stationary arm fixed at its lower section frame 624 and rotatably carrying, at its upper end, one end of a pivot rod 662 journalled therethrough. A companion rocker support gusset member 664 is rockingly carried supported faced inwardly of fixed gusset support member 660. Pivot rod 662, passes through support member 664, but is non-rotatively affixed to its upper end. The lower end of the stationary support arm 664 is fixed to the center of the associated rocker U-frame member 652 so as to rockingly carry the same on, and in response to, rotation of pivot rod 662 for rocking travel, through a travel arc angle sufficient to orient the solar panel receiving plane mutually defined by platform rails 650, 652, i.e., tilt platform rails from a horizontal solar panel receiving attitude (shown in FIGS. 22 and 23) to a tilted panel transfer attitude wherein platform rails 650 and 652 are respectively lined up in registry with associated station rack rails 620a and 620b.

The pivot rocking actuation of rocking carriage 650 is obtained by computer-controlled operation of a hydraulic ram 670 (FIG. 23) pivotally mounted at its lower cylinder end, and thereby affixed, to stationary frame 624. The piston rod 671 of ram 670 is pivotally connected at its upper end to the swingable crank arm 672. In turn, crank arm 672 is connected at its upper end to the protruding other end of pivot rod 662 and non-rotatively coupled thereto for actuating pivot rod 662, and thus swinging support arm 664 through the aforementioned working range of rocker support frame 650 in response to automated hydraulic control.

In the operation of the respective transfer stations 614 and 618, the respectively associated transfer carriage receiving platform rails 640 and 642 are automatically controlled and hydraulically actuated to pivot through a working arc starting from a horizontal solar panel pick-up attitude, wherein transfer carriage arm 628 has been lowered to lay flat on the exposed panel rails 310 and 312 affixed to whatever inverted solar panel module is oriented upside down and exposed as the uppermost inverted solar panel such as solar panel module 104 as shown in FIG. 23.

When transfer gripper arm mechanism 628 is so-oriented, the grippers carried by its transport arms 630 and 632 are actuated to cause the grippers to firmly engage the exposed panel rails 310 and 312. The transfer robot 618 is then actuated, by its computer control system, to first carry the uppermost inverted panel assembly module vertically upwardly as carriage 626 is elevated along tower 622. The robot 618 thus initially carries the gripped module with a generally horizontal attitude until robot carriage 626 is approaching the upper limit of its vertical travel on tower 622. The robot then causes carriage 626 to be pivoted upwardly to thereby swing the supported panel 90 to clear over the top of tower 622 while thereby also inverting the panel from its inverted horizontal stack orientation bottom face up to pivoting the panel to fully upright vertical orientation, and thus, completing the first 90° of the load pivoting motion as the carriage 618 travels upright over the upper end of tower 622. The fully upright vertical orientation of carriage 626 can be seen in FIG. 22 while traveling empty over tower 622 on its return travel path and where it will complete the second 90° pivoting motion to load-pickup horizontal orientation, as seen in FIG. 1, and is then fully inverted to bring the PV module assembly with the glass panels facing upright, as shown in FIGS. 16 and 17, as support carriage 628 is traveling down tower 622 with rails of the solar panel load firmly engaged by the grippers of carriage 628, and having been pivoted to a horizontal attitude as shown in FIG. 24.

In the rail racks panel loading phase of operation of the hydraulically-actuated robot tower 622, the robot drives carriage arm assembly 628 downwardly to an off-load carriage position where panel rails 310 and 312 extend across and rest upon the uppermost flanges of transfer Z-section channels 640 and 642 of tilt mechanism 618. Solar panel assembly 104 is oriented horizontally and extends over the ends of transfer channels 640 and 642, closest to, rails 620a and 620b that in turn are disposed in an angled plane closely spaced to the ends of rack rails 620a and 620b, as shown In FIGS. 22 and 23. As the carriage arm assembly 628 travels through the space between tilt platform rails 640 and 642 of the tilting carriage when disposed in a horizontal plane. The solar panel assembly module rails 130 and 132 engage and rest upon the horizontal flanges of tilt support rails 640 and 642. The carriage arm assembly 628 then continues its downward travel so as to be clear of tilt platform support channels 650 and 652 until the carriage reaches its lowermost stop position where the carriage components are disposed within the confines of the pivoting frame 650 in non-interfering relation therewith.

Figure 20:
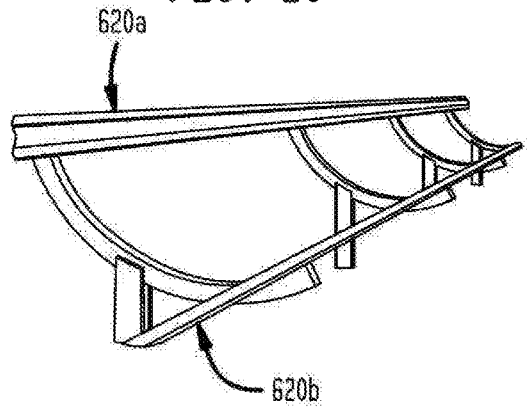
FIG. 20 is a perspective view of one embodiment of a solar panel array rack in accordance with the system of co-pending U.S. Ser. No. 13/553,795, as ground-installed.
Figure 21:
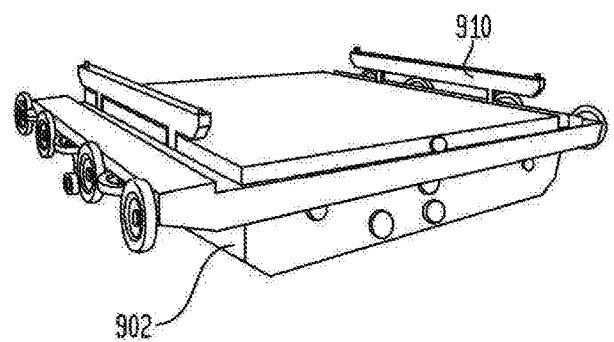
FIG. 21 is a perspective view of one embodiment of an operable automated drone which is battery-powered and monitored by the drone monitoring station of FIG. 19.

The pivotal panel support mechanism of tilt frame 650 is then actuated to cause the solar panel to bodily pivot about the axis of pivot rod 652 so as to bring the solar panel into the tilted attitude matching the tilt of rack rails 620a and 620b relative to each other and with the mutually inwardly facing flanges 644 and 646 tilt-aligned with the inwardly extending flanges of rack rails 620a and 620b. This enables the remote-controlled drone 902 with its super-posed panel rail gripping mechanism 910 to be lowered into its lowermost position on the drone, and then the drone 902 to be actuated to travel with its opposite side wheels running on associated flanges 644 and 646 of transfer rails 640 and 642 so that the rails of drone lift mechanism 910 touch the panel assembly module rails 310 and 312 resting on the upper flanges of platform channels 640 and 642. The lift mechanism of drone 902 is then actuated to elevate and engage the panel assembly module rails 310 and 312 and elevate them upwardly off of transfer platform rails 640 and 642 and carry the tilted panel supported on carriage 910 of drone 902 with the solar panel tilted to match the tilted orientation of the rack rails 620a and 620b to match their tilt angle for drone-supported travel on the rails to bring the solar panel being carried on the drone 902 in tilted orientation and spaced above the rails 620a and 620b until the drone-supported solar panel reaches its installation location on the dual rail support rack shown as installed and ground-mounted in FIG. 20, as described in the aforementioned co-pending patent application.

Figure 19:
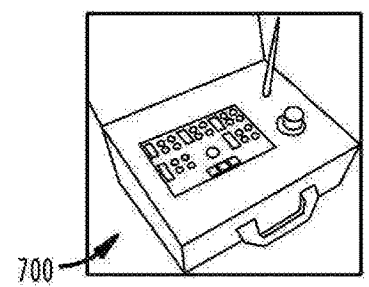
FIG. 19 is a perspective view of a drone monitoring station constructed to record drone telemetry and provide a watch dog radio signal that, when halted, acts as an emergency stop to all robots operating at the site.

Drone monitoring station 700, shown in FIG. 19, is constructed to record drone telemetry and provide a watch dog radio signal that, when halted, acts as an emergency stop to all robots operating at the site."Once operation is initiated, both the autoloader and the drones worked autonomously.

Referring in more detail to FIGS. 25-47, and supplementing the photographic views of the structure of operable embodiments of various structural features shown in FIGS. 13, 14, 16, 18, 19, 21-24, a successful working embodiments of the system, method, and apparatus of the present invention.

Figure 26:
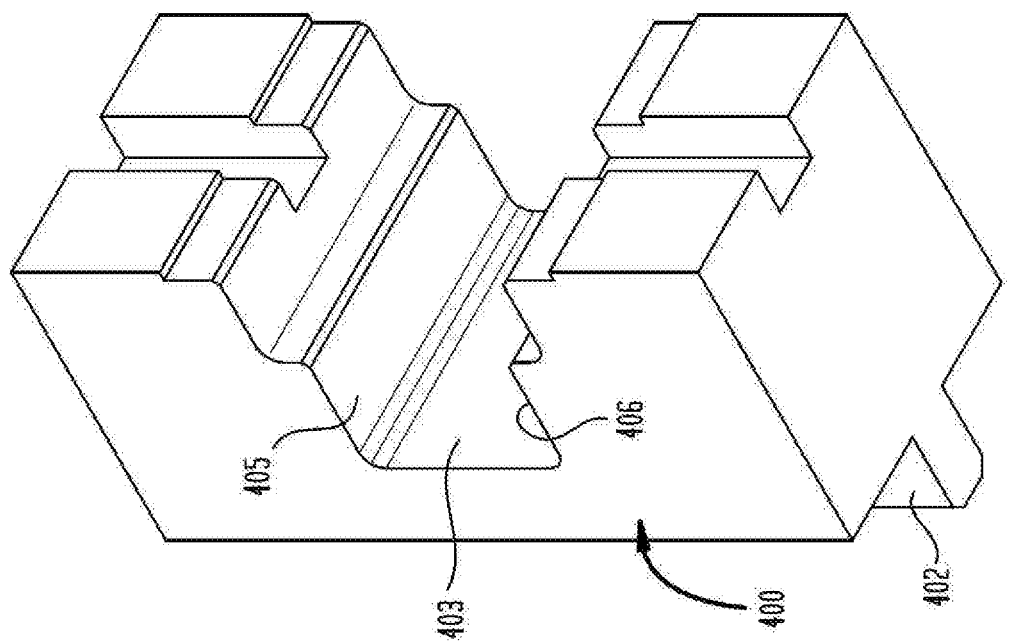
FIG. 26 is another isometric view of stacking block 400 oriented in a different direction than shown in FIG. 25.
Figure 25:
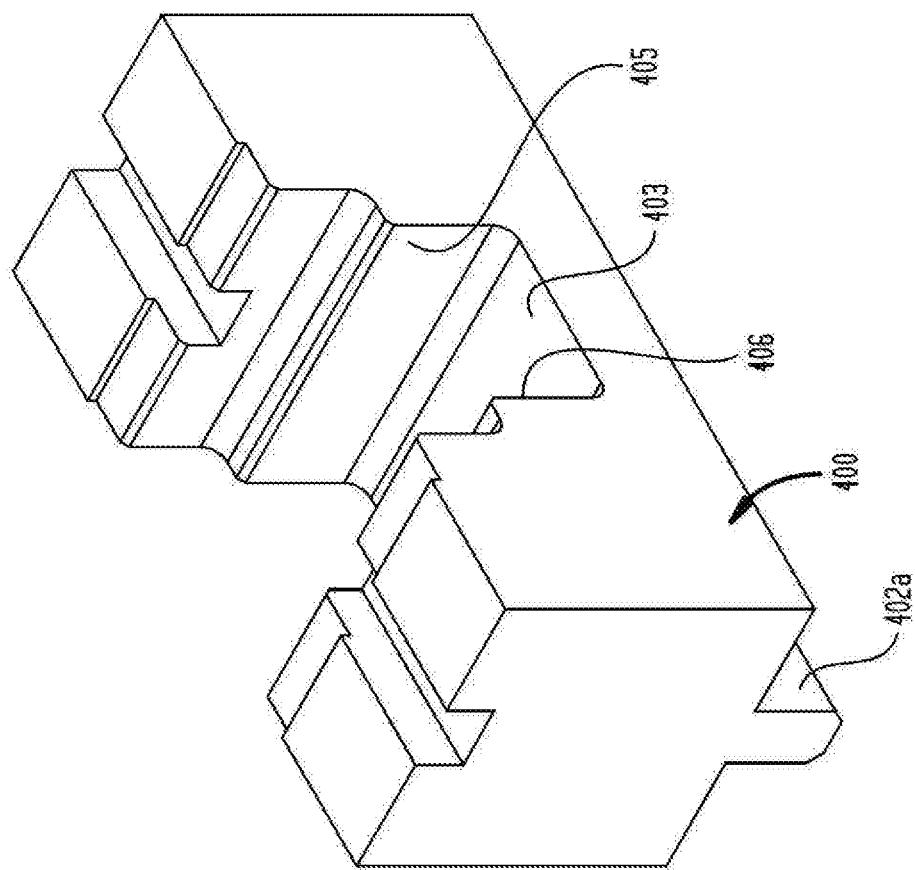
FIG. 25 is an isometric view of a stacking block 400 described in conjunction with FIGS. 9 and 10, and referenced as 400*a* and 400*b* therein.
Figure 27:
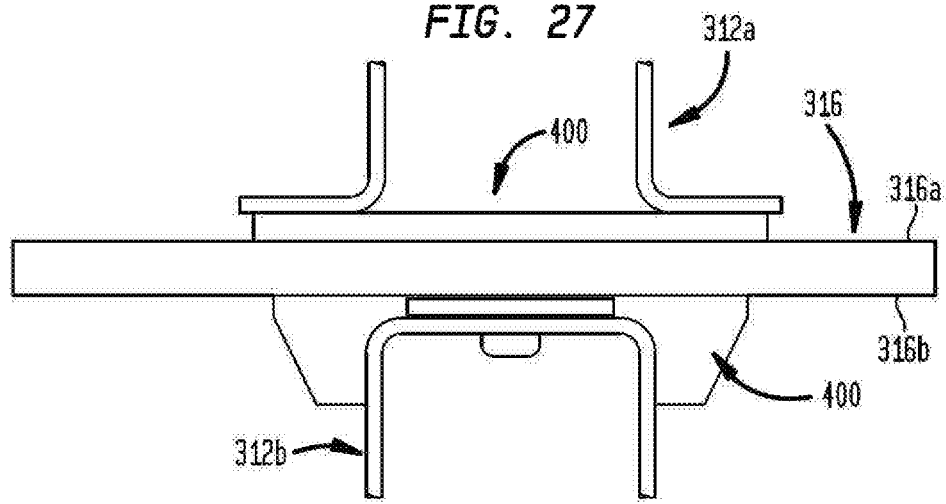
FIG. 27 is a center cross-section view showing associated rails 312*a* and 312*b* facing the shady-side-surface 316*a* and the sunny-side-surface 316*b* of solar panel 316 as oriented in stack-up 102 of FIG. 1.
Figure 28:
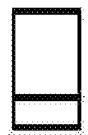
FIGS. 28, 29, 30, 31, 32, 33, 34, and 35 shown in pairs comprising the even-numbered figures and the next consecutive odd-numbered figure, of alternative illustrative spacer block configurations, the spacer block configuration of FIGS. 30 and 31 being presently preferred.
Figure 29:
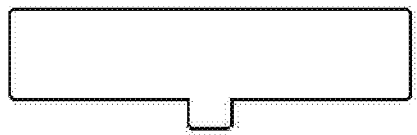
Figure 30:
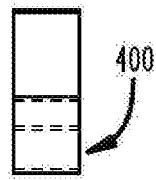
Figure 31:
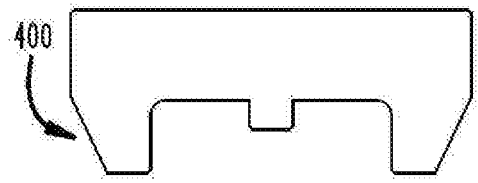
Figure 32:
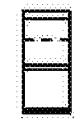
Figure 33:
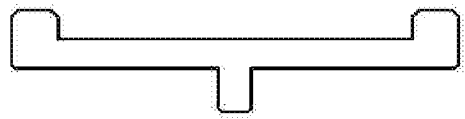
Figure 34:
Figure 35:
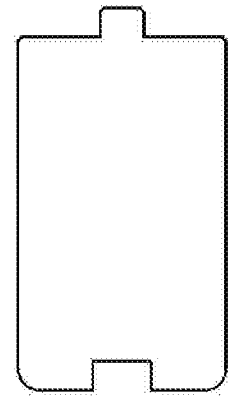
Figure 36:
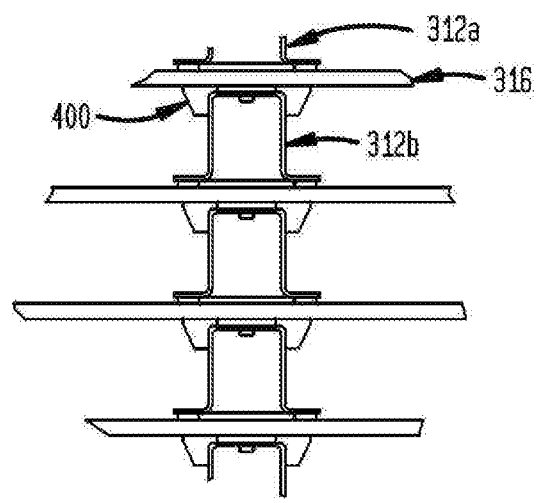
FIGS. 36 and 37 are fragmentary end and isometric views of a four panel stack-up using rails identical to those shown in FIG. 27 to respectively laterally space apart a vertical stack-up of spacer rails configured in cross-section the same as FIGS. 30 and 31.
Figure 37:
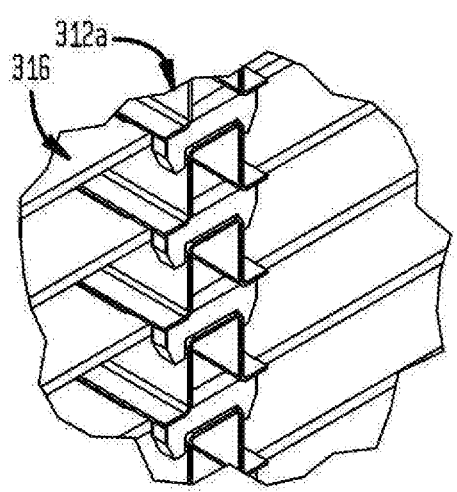
Figure 38:
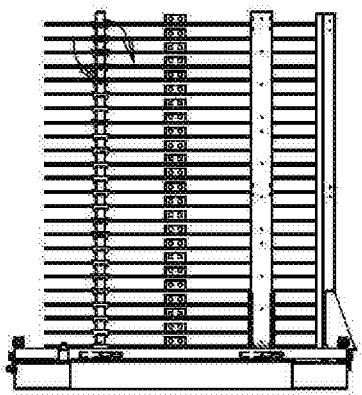
FIGS. 38 and 39 are end elevational and perspective views, respectively, with the solar panels completed and oriented in a stack-up slightly modified from the stack-up of FIG. 1.
Figure 39:
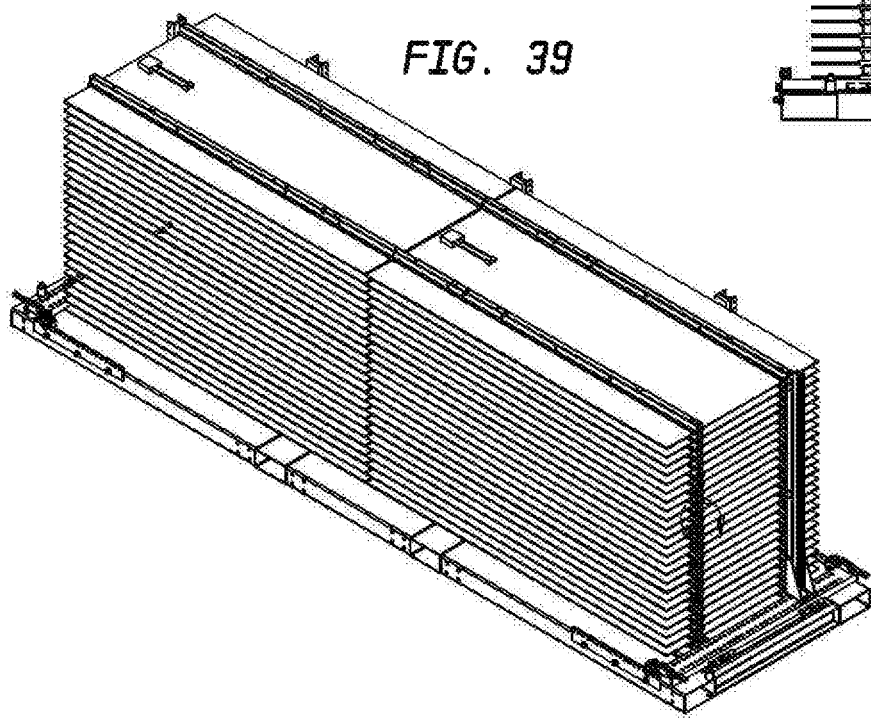

Referring first to construction and use of the space blocks shown in FIGS. 25-37, in conjunction with the perspective drawing views provided in FIG. 5 through 10 and FIG. 11c, assembly and use of the spacer blocks are shown in FIGS. 9, 10, and 27. Referring to FIGS. 25 and 26, spacer block 400 is preferably accurately machined, die-cast, or injection-molded, such that its longitudinal bottom projection 402a enters into the gap formed between the mating, or opposed longitudinal edges, of an associated pair of solar panels as shown in FIG. 9. This helps the accurate positioning of solar panel rails relative to the associated solar panels, and also helps to protect the longitudinal side edges of an adjacent pair of solar panels.

Spacer blocks 400 have a transverse U-shaped channel of constant cross-sectional configuration extending all the way through and open at the ends of the spacer block. These channels are defined by accurately spaced apart, and parallel, side surfaces 405 and 406, that are designed to have a close slip fit as the space block is aligned with an associated rail end and slidably pushed down to seated position with the crown and adjacent parallel sides of the rail fitting nicely within groove 403.

The slip fit installation and removal characteristic of the spacer blocks relative to the associated solar panel rails helps maintain the rail assembly accurately in the panel jig 100 but does hinder the separation of the spacer blocks from their associated panel rails when the panel is being inverted and installed on the associated field support rack.

Spacer block 400, as well as the remaining variations thereof in FIGS. 28-35, have basically been described previously in connection with FIG. 11c.

Referring to the structure, function, and operation, of the "flipper" station for transferring solar panels one at a time from the platform loading station to the rails of the field rack solar panel array, is best seen in FIGS. 40-47, and will be described hereinafter with respect to these figures.

Figure 40:
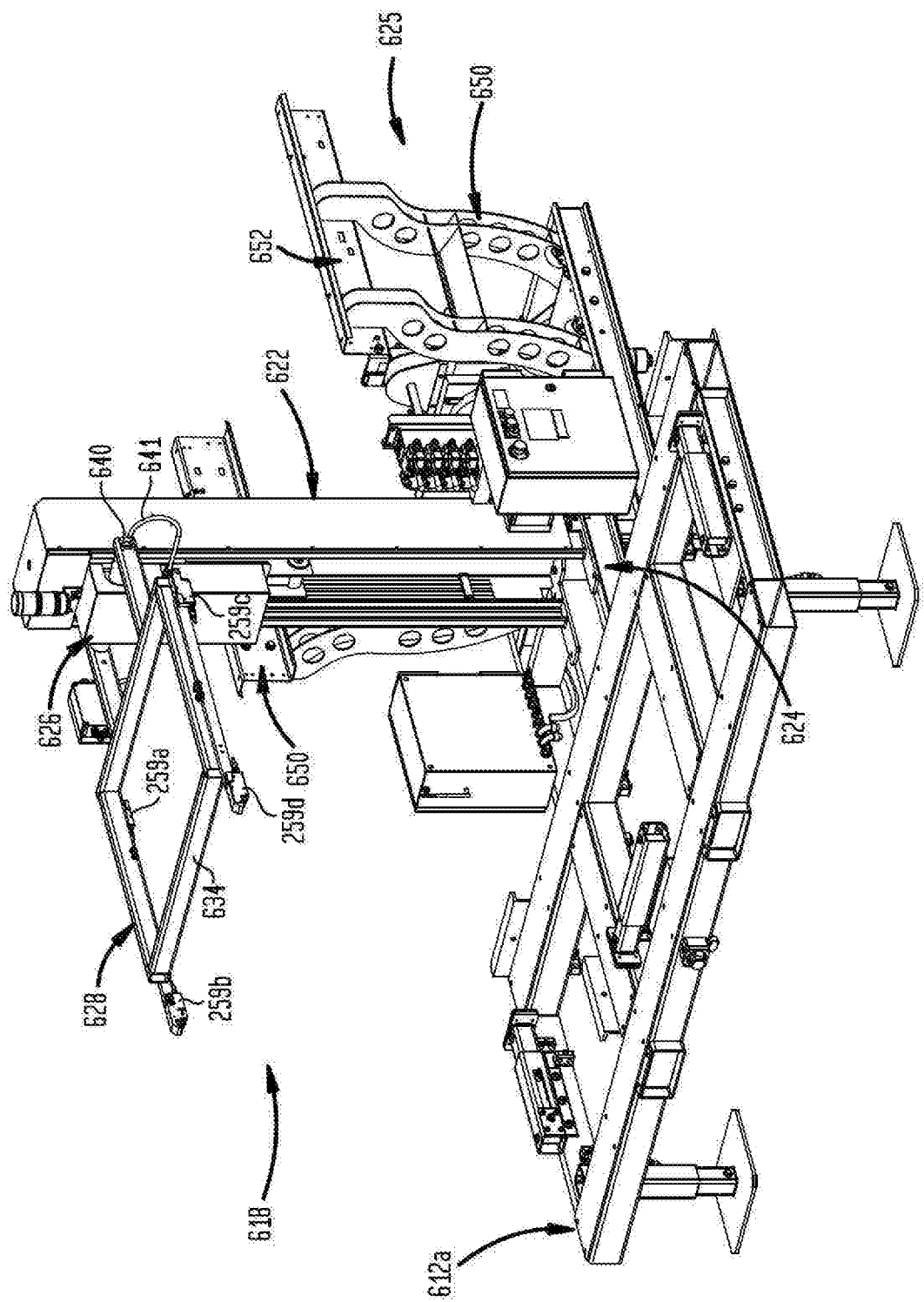
FIG. 40 is perspective assembly view of the robot transfer station having a stationary platform for receiving as input the palletized stack-up 102, as shown in FIG. 16, and also having an upright robotic tower provided with the pivotable panel carrier frame duly supported thereon and pivotally-actuated to swing the pick-up box arm through approximately 180° over the top of the robotic tower and to lower the panel, as a stack-up, onto the stationary receiving platform as shown by panel stack-up 102*b* (FIG. 16)
Figure 41:
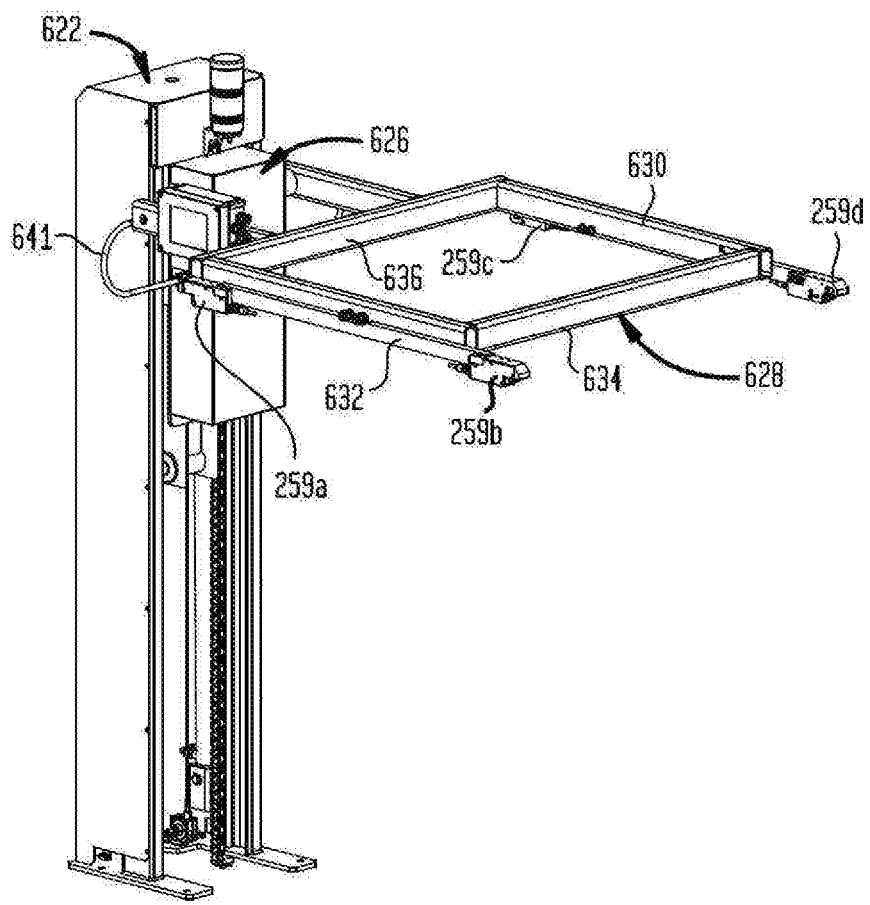
FIG. 41 is a perspective view of the upright robotic tower equipped with two ram-actuated chain drives, one rigged for pivoting the gripper pick-up arm of the robot, and the other for raising and lowering the pick-up arm and associated carriage, up and down on the robot tower.
Figure 42:
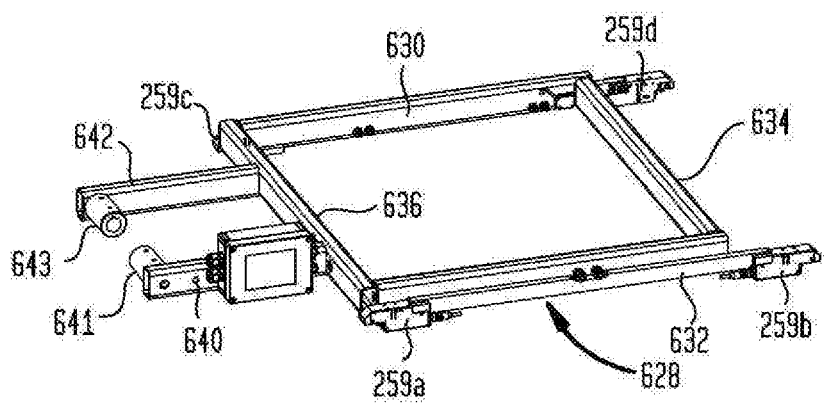
FIG. 42 is a perspective view of the box assembly of the pick-up arm shown in horizontal position by itself.
Figure 43:
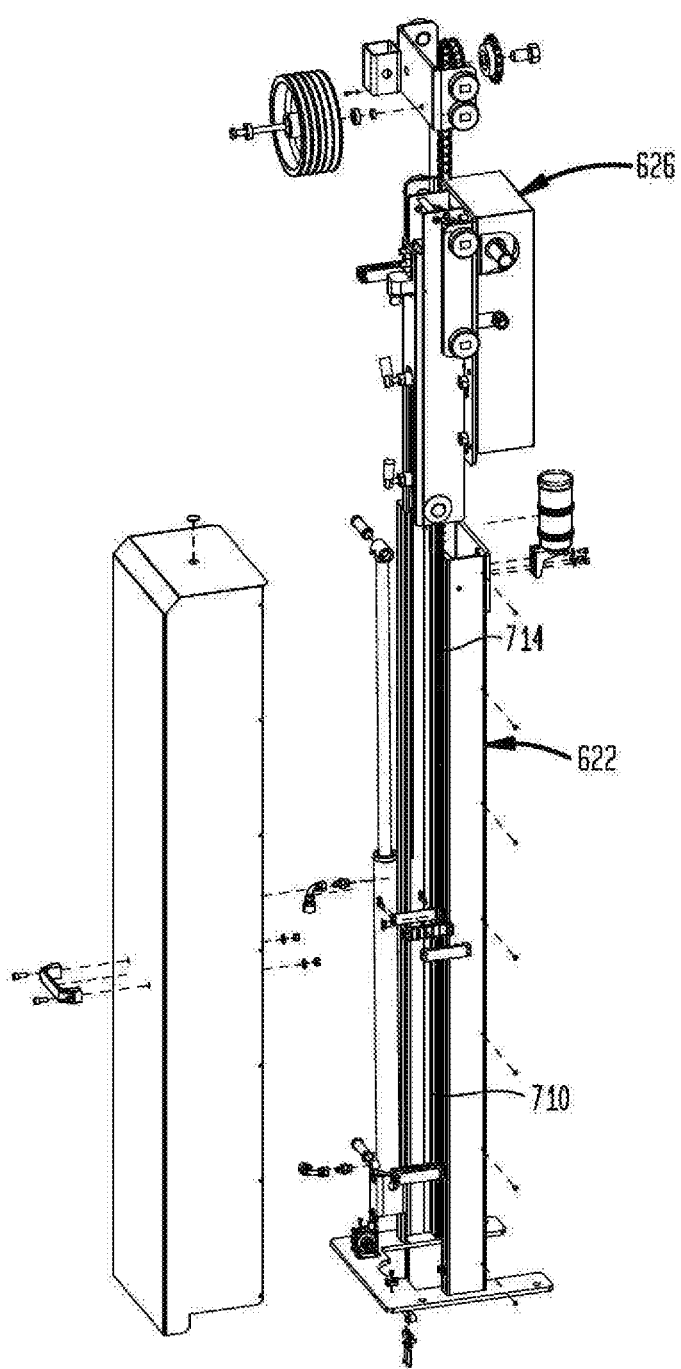
FIG. 43 is a semi-exploded perspective view of the hydraulic and chain drive components of the transfer and inverting ram as shown in detail in FIGS. 40, 41, 42, and 43.
Figure 45:
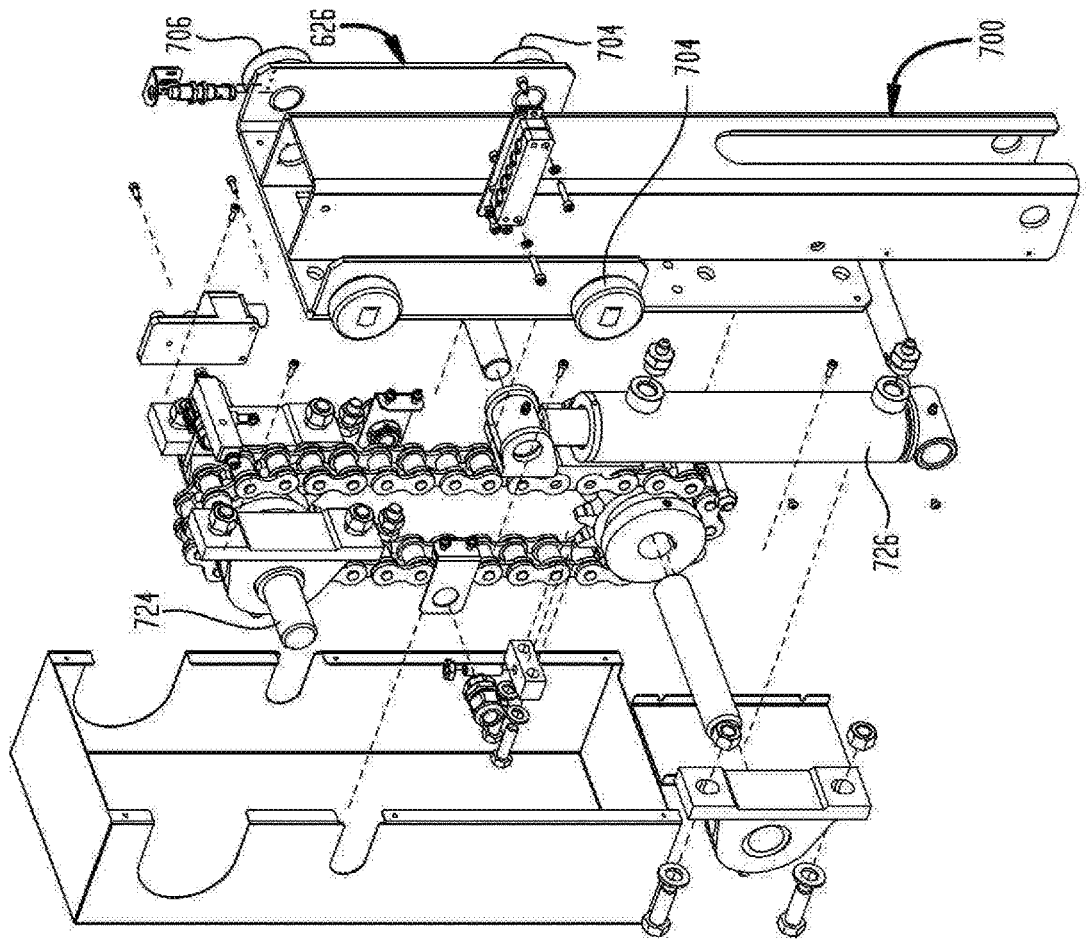
FIGS. 44 and 45 show the pivotal panel pick-up arm mechanism in a perspective assembly view of FIG. 44 and exploded in the perspective view of FIG. 45, that rotates the oppositely extending pair of protruding drive shafts that non-rotatively are affixed to the pivoting arm that carries and pivots the pick-up arm.

Referring first to the assembly view of FIG. 40, the load-receiving platform 612a, as seen ground-mounted, at the front end of station 618. The base of robot tower 622 is mounted on a channel framework attached to the rear of platform 612a. The carriage 626 has upright channel member 700 of channel configuration carrying on each side a pair of vertically-spaced rollers removably supporting the carriage on the cooperative frame walls of tower 622. A vertically-extending ram has the lower end of its cylinder fixed to the base of the tower and the upper end of its pistons carrying a sprocket on which a carriage-elevating chain is trained with one run extending stationarily down to a fixed point at the base of the train as seen in FIG. 41, and the other trained around a sprocket at the upper end of the carriage as seen in FIG. 43.

Figure 44:
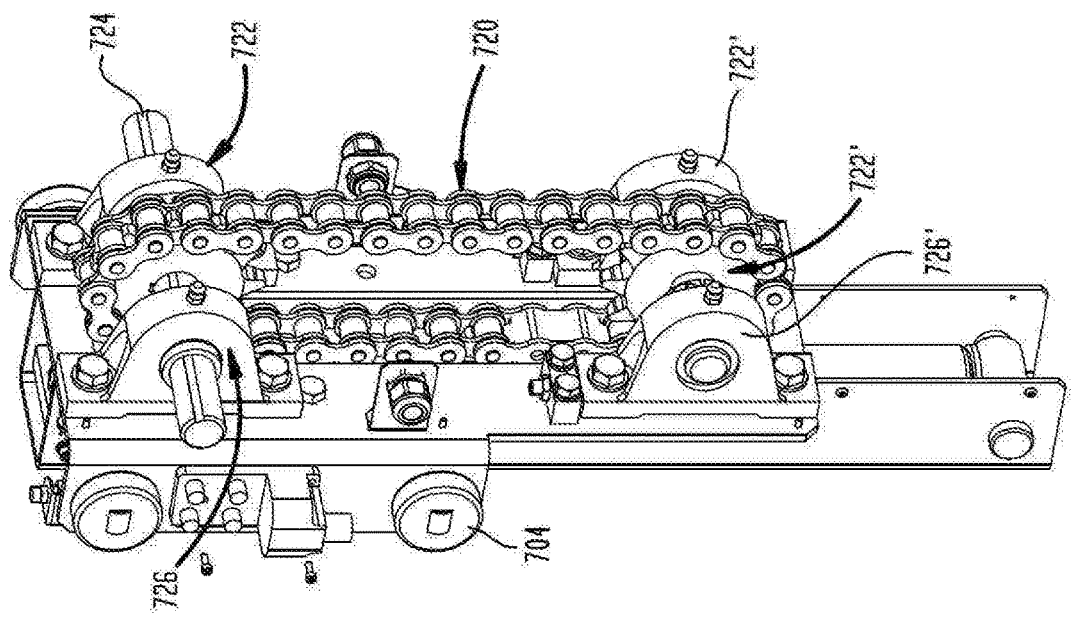
Figure 46:
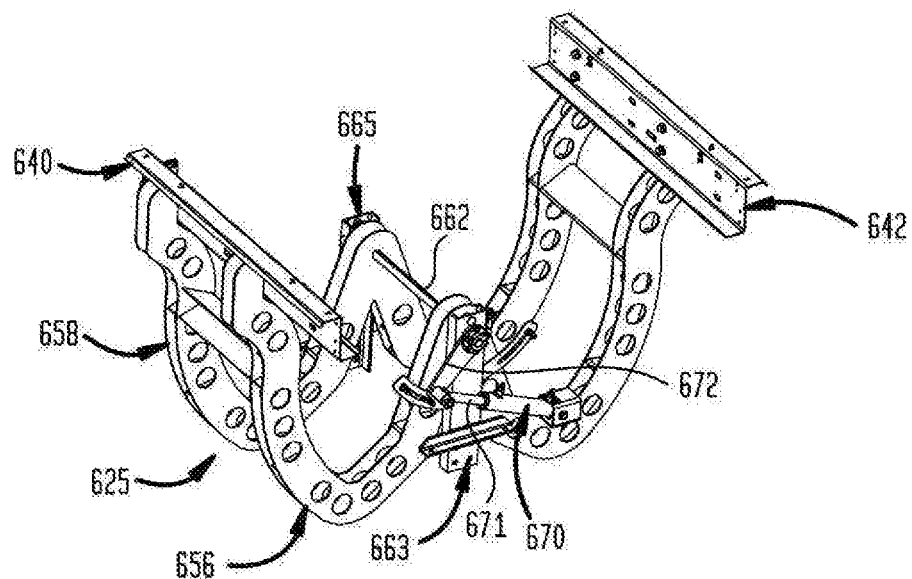
FIG. 46 is a perspective view and FIG. 47 is partially exploded view of the tilting mechanism and framework for operably supporting the receiving channels 650 and 652, and also the transfer and tilt station disposed between the upright robot mechanism and the input end of an associated rack row.
Figure 47:
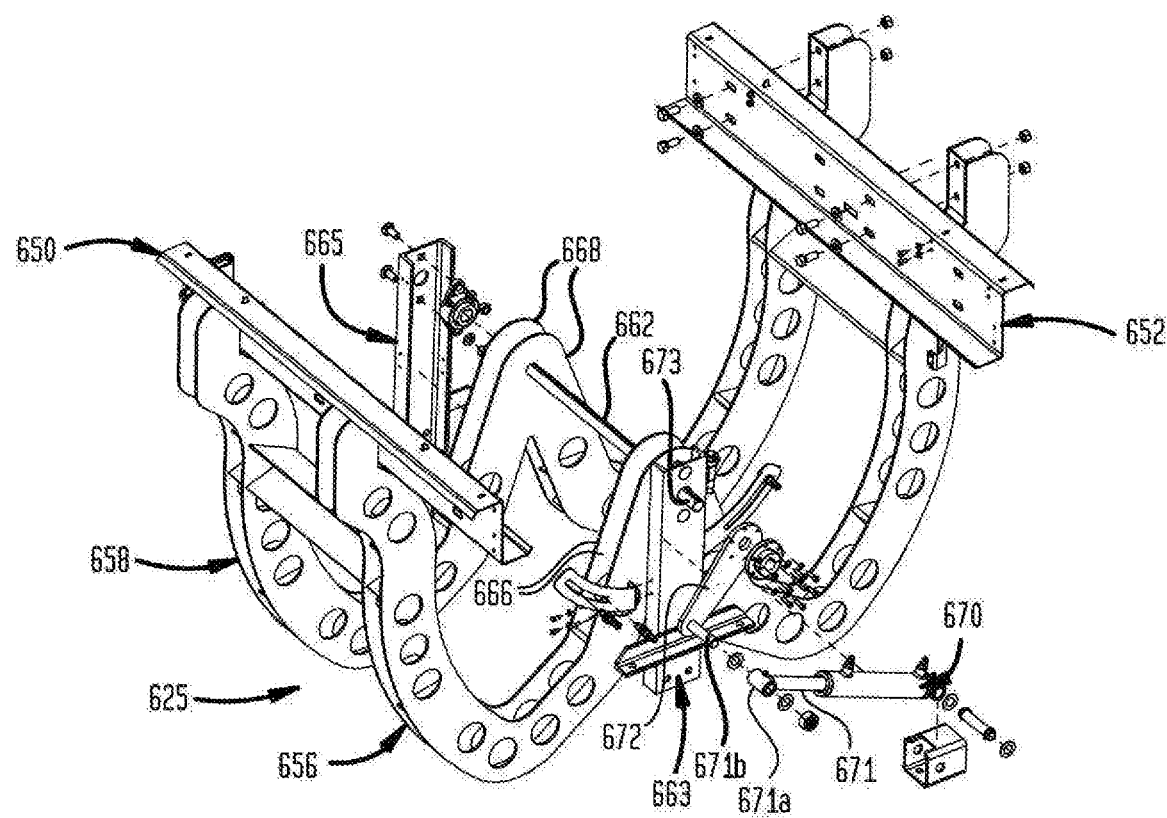

As seen in FIG. 44, the gripper arm pivoting motion is provided by a chain 720 looped over two sprockets 722 and 722' (only one sprocket being shown in the figure), each fixed to a shaft 724 and 724' extending through a pair of bearings 722 and 726. The inner ends of lift-arm carriage are non-rotatively affixed to the rotary shaft 724. The chain loop 720 is fixedly coupled to the upper end of the piston of ram 726 that is used to produce the pivoting motion of the grip arm assembly. The ram 726, through chain 720, causes the pivot rod 724 to rotate, and thereby causing the pivoting motion of the gripper arms while the same travel up and down with the carriage, the vertical motion being produced by vertical travel of the carriage. Thus, the compound motion of the pivot arms, namely the vertical motion of the carriage carrying the pivot arms bodily up and down. The carriage arms can be independently pivoted by the pivot shaft whose pivoting rotary drive is carried with the carriage as it is being moved vertically by the ram.

It is also to be noted that the rigging arrangement for the vertical actuation of the carriage is rigged to produce a 2:1 distance.

The solar panel stack unloading work, wherein each solar panel module is lifted off its uppermost position on the multiple panel stack-up on the pallet jig at the input station to the inverter station is shown in the discussion of FIGS. 16, 22, 23, 24, 44, and 45. The tilt station mechanism is best seen in the perspective assembly view of FIG. 26, taken in conjunction with the exploded perspective view of FIG. 47. This is supplemental to the previous discussion of the tilting and transferring PV panel station comparable for individually-loading drone-mounting solar panels one-at-a-time onto the rail racks described previously.

From the foregoing description in conjunction with the appended drawings, as well as the description, drawings, and claims of co-pending patent application U.S. Ser. No. 13/553,795 and underlying provisional application U.S. Ser. No. 61/804,620 filed on Mar. 22, 2013, incorporated herein by reference, it will be understood that the system, apparatus, and method of PV power plant construction provides improved results, benefits, and advantages over the prior art apparatus and systems for installing and equipping PV power plant construction. By automating the requisite processes of assembling, transporting and positioning the thousands of PV panels required for large-scale projects, the system of the invention enables megawatt-per-day panel installation rates with just a small construction crew. Moreover, this automation is achieved with no additional installation materials.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof. Moreover, the technical effects and technical problems in the specification are exemplary and are not limiting. The embodiments described in the specification may have other technical effects and can solve other technical problems.

What is claimed is:

1. An assembly jig and fork-lift transport pallet arrangement for holding, supporting, and transporting a stack of solar panel modules, each solar panel module comprising a laterally-orientated, coplanar array of two or more PV solar panels, the solar panels having an upward-facing operable side and a downward-facing opposite side, including two parallel support rails transversely spanning the downward-facing opposite sides of the PV solar panels, the arrangement comprising:

horizontal base members and stringer beams configured to form a rectangular pallet, the pallet being sized to closely approximate the size of one of the solar panel modules comprising the stack, the stringer beams having openings at their opposite longitudinal ends, the openings being configured to accept the tines of a forklift truck removable upright corner support posts on a long side of the rectangular pallet;

pivotally attached upright end support posts on the two longitudinally-opposed shorter sides of the rectangular pallet, the upright end support posts being horizontally spaced apart to align with the two parallel support rails transversely spanning the PV solar panels; and jig locating supports in the form of inwardly facing protrusions on the removable upright corner support posts and on the pivotally attached upright end support posts, the jig locating supports being positioned to support and hold a solar panel module in place relative to a second solar panel module in the stack, the jig locating supports on the pivotally attached upright end support posts being vertically spaced apart to engage the support rails attached to the underside of a solar panel module.

2. The arrangement of claim 1, wherein the jig locating supports are lugs that interengage with the support rails.

3. The arrangement of claim 1, wherein the support rails are affixed to the PV solar panels comprising a solar panel module by an adhesive bead, the jig locating supports being vertically spaced apart to support the solar panel module at a height to apply appropriate contact pressure and to ensure that the thickness of the adhesive bead, affixing the rails is uniform.

4. The arrangement of claim 1 further including removable stacking blocks configured to accommodate the support rails and that are slidably installed on a support rail so that the weight of the stack of solar panel modules is distributed through the stacking blocks and support rails.

5. The arrangement of claim 4 wherein the stacking blocks have projections that fit in a gap between mutually facing longitudinal edges of adjacent PV solar panels comprising the solar panel module.

6. The arrangement of claim 5 wherein the removable stacking blocks are further provided with a notch to provide a gap between the stacking block and an adjacent vertical side of the support rail to form a suitable passageway for accommodating the electrical wiring.

7. A frameless solar panel module the assembly jig and fork-lift transport pallet arrangement of claim 1 comprising two or more PV solar panels, the solar panels having an upward-facing operable side and a downward-facing opposite side, a pair of parallel support rails being attached to and transversely spanning the downward-facing side of the PV solar panels, the parallel support rails being spaced apart and configured to engage the jig locating supports on the pivotally attached upright end support posts of the assembly jig and fork-lift transport pallet arrangement.

8. The frameless solar panel module and the assembly jig and fork-lift transport pallet arrangement of claim 7 wherein the rails are thin gauge steel and are configured to mate with a rack rail of a solar array system.

9. A method of assembling a solar panel array and populating a solar panel field array comprising the steps of:
pre-panelizing a solar panel module by installing rails and electrical components on a normally downward-facing surface of the solar panel module;
placing the pre-panelized solar panel module for transport on the assembly jig and fork-lift transport pallet arrangement of claim 1, the solar panel module being oriented with the downward-facing surface up;
stacking another pre-panelized solar panel module on the placed pre-panelized solar panel module form a stack;
conveying the stack of pre-panelized solar panel modules to the vicinity of the an end-loading position of a ground-mounted rack in a solar panel field array;
gripping the installed rails of the uppermost solar panel module to remove it from the stack;
inverting the solar panel module to be oriented with the normally downward-facing surface down; and
positioning the inverted solar panel module for transport to its final location on the ground-mounted rack.

10. The method of claim 9 wherein the gripping and inverting step is accomplished with an automated hydraulic robot.

11. The method of claim 9 wherein the step of positioning the inverted solar panel module for transport comprises placing the inverted solar panel module on a shuttle for conveying the solar panel to a position in the solar panel field array.

\* \* \* \* \*